(12) United States Patent
Oosawa et al.

(10) Patent No.: US 8,841,719 B2
(45) Date of Patent: Sep. 23, 2014

(54) SEMICONDUCTOR DEVICE AND METHOD FOR MANUFACTURING THE SAME

(75) Inventors: Seigo Oosawa, Nukata-gun (JP); Shoji Mizuno, Okazaki (JP); Yutaka Tomatsu, Okazaki (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 13/347,004

(22) Filed: Jan. 10, 2012

(65) Prior Publication Data

US 2012/0199900 A1 Aug. 9, 2012

(30) Foreign Application Priority Data

Jan. 12, 2011 (JP) .................................... 2011-3962
Feb. 8, 2011 (JP) ................................... 2011-24785
Dec. 12, 2011 (JP) ................................ 2011-271505

(51) Int. Cl.
*H01L 29/417* (2006.01)
*H01L 29/66* (2006.01)
(Continued)

(52) U.S. Cl.
CPC ......... *H01L 29/7397* (2013.01); *H01L 29/0615* (2013.01); *H01L 29/1095* (2013.01);
(Continued)

(58) Field of Classification Search
CPC ............ H01L 29/7811; H01L 29/7802; H01L 29/7813; H01L 29/66712; H01L 29/66674; H01L 29/66734; H01L 21/28
USPC ........... 257/330, 331, 332, 333, 337, 60, 135, 257/242, 263, 302, E21.66, E21.693
See application file for complete search history.

(56) References Cited

U.S. PATENT DOCUMENTS 5,686,750 A * 11/1997 Takahashi ...................... 257/328
7,405,452 B2 * 7/2008 Yilmaz ........................ 257/409
(Continued)

FOREIGN PATENT DOCUMENTS

JP A-62-198165 9/1987
JP A-8-274310 10/1996
(Continued)

OTHER PUBLICATIONS

English translation of Kusunoki, JP 2010-118548 A, Dated May 27, 2010, translated on Jun. 5, 2013.*

(Continued)

*Primary Examiner* — Julia Slutsker
*Assistant Examiner* — Natalia Gondarenko
(74) *Attorney, Agent, or Firm* — Posz Law Group, PLC

(57) ABSTRACT

A semiconductor device includes: a semiconductor substrate; an interlayer film on the substrate; a surface electrode on the interlayer film; a surface pad on the surface electrode; a backside electrode on the substrate; an element area including a cell portion having a vertical semiconductor element and a removal portion having multiple contact regions; and an outer periphery area. The surface electrode in the removal portion is electrically coupled with each contact region through a first contact hole in the interlayer film. The surface electrode in the cell portion is electrically coupled with the substrate through a second contact hole in the interlayer film. A part of the surface electrode in the removal portion facing each contact region is defined as a contact portion. The surface electrode includes multiple notches on a shortest distance line segment between each contact portion and the surface pad.

8 Claims, 24 Drawing Sheets

(51) Int. Cl.
*H01L 29/739* (2006.01)
*H01L 23/00* (2006.01)
*H01L 29/78* (2006.01)
*H01L 29/06* (2006.01)
*H01L 29/10* (2006.01)
*H01L 29/45* (2006.01)
*H01L 29/40* (2006.01)

(52) U.S. Cl.
CPC ...... H01L 29/41741 (2013.01); *H01L 29/0696* (2013.01); *H01L 2224/04042* (2013.01); H01L 29/66734 (2013.01); H01L 29/456 (2013.01); *H01L 29/402* (2013.01); *H01L 2924/13055* (2013.01); *H01L 2224/4911* (2013.01); *H01L 2924/13091* (2013.01); *H01L 29/41766* (2013.01); *H01L 29/0634* (2013.01); H01L 24/49 (2013.01); H01L 29/66727 (2013.01); H01L 29/7813 (2013.01); H01L 29/7805 (2013.01); H01L 29/7811 (2013.01)
USPC .......... 257/330; 257/331; 257/332; 257/337; 257/678

(56) References Cited

U.S. PATENT DOCUMENTS

| | | | |
|---|---|---|---|
| 2004/0124461 A1* | 7/2004 | Gajda | 257/330 |
| 2010/0001344 A1* | 1/2010 | Stefanov et al. | 257/339 |
| 2010/0084706 A1* | 4/2010 | Kocon | 257/330 |
| 2010/0118455 A1 | 5/2010 | Kusunoki | |
| 2010/0258863 A1* | 10/2010 | Kaneko | 257/330 |
| 2012/0248499 A1 | 10/2012 | Kusunoki | |

FOREIGN PATENT DOCUMENTS

| | | |
|---|---|---|
| JP | B2-3424553 | 5/2003 |
| JP | A-2009-94158 | 4/2009 |
| JP | A-2010-135526 | 6/2010 |

OTHER PUBLICATIONS

Office Action mailed Jan. 22, 2013 in corresponding JP Application No. 2011-024785 (and English translation).

Office Action mailed Aug. 20, 2013 in the corresponding JP application No. 2011-271505.

* cited by examiner

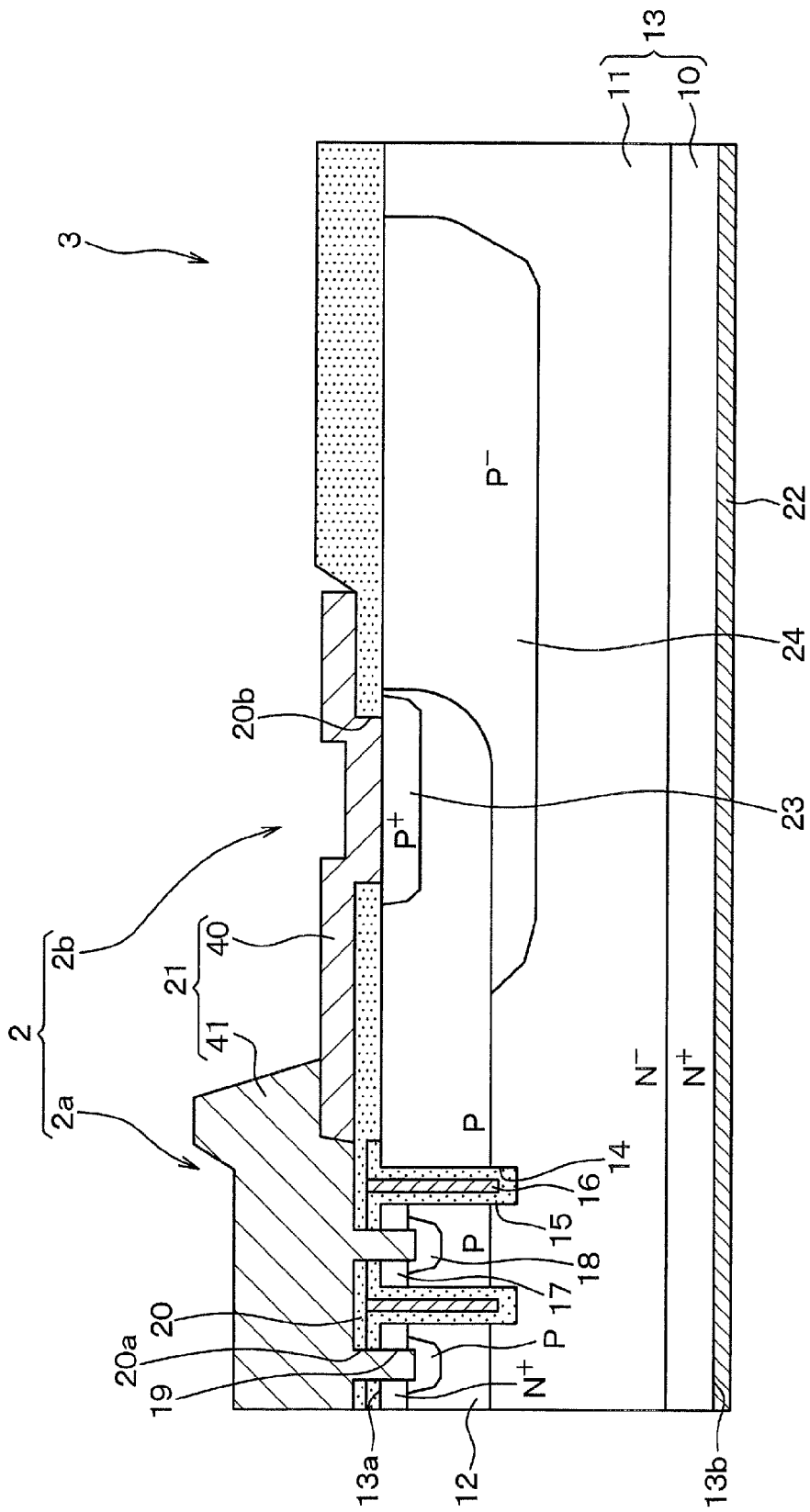

SEMICONDUCTOR DEVICE AND METHOD FOR MANUFACTURING THE SAME

CROSS REFERENCE TO RELATED APPLICATIONS

This application is based on Japanese Patent Applications No. 2011-3962 filed on Jan. 12, 2011, No. 2011-24785 filed on Feb. 8, 2011, and No. 2011-271505 filed on Dec. 12, 2011, the disclosures of which are incorporated herein by reference.

TECHNICAL FIELD

The present invention relates to a semiconductor device having a semiconductor element with first and second electrodes, which flows current therebetween, and a method for manufacturing a semiconductor device.

BACKGROUND

Conventionally, JP-A-2009-94158 teaches a semiconductor device having an IGBT (i.e., insulated gate bipolar transistor) region, a diode region and a gate runner region. An IGBT is formed in the IGBT region. A diode is formed in the diode region. An emitter electrode and a surface pad for coupling with an external device are formed on a surface of the diode region. A wiring for the IGBT and a wiring for the diode are arranged on the gate runner region. The gate runner region is an outer periphery region of the IGBT region and the diode region so that the gate runner region is disposed on the outside of the IGBT region and the diode region. A P conductive type well is formed in a surface portion of a semiconductor substrate in the gate runner region. Further, a contact region having a P+ conductive type for reducing a resistance of the well is formed in a surface portion of the P conductive type well.

In the above structure, when the semiconductor device recovers, a hole accumulated in the gate runner region is removed to the outside via the contact region and an emitter electrode and the surface pad.

Accordingly, the hole is not concentrated at an end of the contact region in the IGBT region on a gate runner region side. Thus, the recovery breakdown is restricted.

However, in the above prior art, in order to easily remove the hole in the gate runner region, multiple contact regions having the P+ conductive type for reducing the resistance of the P conductive type well are formed. Thus, the recovery withstand of the semiconductor device is improved. However, the hole is concentrated at one of the contact regions having a low resistance because of the variation of the impurity concentration in the contact regions. Temperature of a place, at which the hole is concentrated, increases, so that recovery breakdown may occur at the place. Accordingly, in a structure having multiple contact regions, the recovery withstand is not obtained stably.

In the above case, the semiconductor device includes the IGBT. Alternatively, the semiconductor device may include a MOSFET or the like. In this case, a hole is accumulated in an outer periphery region. In this case, it is difficult to obtain the recovery withstand stably.

SUMMARY

In view of the above-described problem, it is an object of the present disclosure to provide a semiconductor device having stable recovery withstand. It is another object of the present disclosure to provide a method for manufacturing a semiconductor device having stable recovery withstand.

According to a first aspect of the present disclosure, a semiconductor device includes: a semiconductor substrate having a first conductive type and including a first surface and a second surface opposite to the first surface; an interlayer film disposed on the first surface of the semiconductor substrate; a surface electrode disposed on the interlayer film; a surface pad for electrically coupling with an external device, the surface pad disposed on the surface electrode; a backside electrode disposed on the second surface of the semiconductor substrate; an element area; and an outer periphery area disposed on an outer periphery of the element area. The element area includes: a cell portion having a vertical semiconductor element for flowing current between the surface electrode and the backside electrode, the vertical semiconductor element including an element structure on a first surface side of the semiconductor substrate; and a removal portion disposed on an outer periphery of the cell portion and including a plurality of contact regions on the first surface side of the semiconductor substrate, each contact region having a second conductive type. The surface electrode in the removal portion is electrically coupled with each contact region through a first contact hole in the interlayer film. The surface electrode in the cell portion is electrically coupled with the semiconductor substrate through a second contact hole in the interlayer film. A part of the surface electrode in the removal portion facing each contact region through a corresponding first contact hole is defined as a contact portion. The surface electrode includes a plurality of notches, each of which is disposed on a shortest distance line segment between a corresponding contact portion and the surface pad.

In the above device, the hole flowing into the surface electrode via the contact hole in the removal portion flows into the surface pad to bypass the notch. Accordingly, the distance of the hole path from the contact portion to the surface pad increases, compared with a case where the device has no notch. Thus, the resistance of the hole path increases, and therefore, the hole does not easily flows into the contact region. Thus, even if the impurity concentrations of the contact regions are varied, the hole concentration at a specific contact region is restricted. Thus, the recovery withstand of the device is stably obtained.

According to a second aspect of the present disclosure, a semiconductor device includes: a semiconductor substrate having a first conductive type and including a first surface and a second surface opposite to the first surface; an interlayer film disposed on the first surface of the semiconductor substrate; a surface electrode disposed on the interlayer film; a surface pad for electrically coupling with an external device, the surface pad disposed on the surface electrode; a backside electrode disposed on the second surface of the semiconductor substrate; an element area; and an outer periphery area disposed on an outer periphery of the element area. The element area includes: a cell portion having a vertical semiconductor element for flowing current between the surface electrode and the backside electrode, the vertical semiconductor element including an element structure on a first surface side of the semiconductor substrate; and a removal portion disposed on an outer periphery of the cell portion and including a plurality of contact regions on the first surface side of the semiconductor substrate, each contact region having a second conductive type. The surface electrode includes: a first surface electrode in the removal portion contacting each contact region of the semiconductor substrate through a first contact hole in the interlayer film; and a second surface electrode in the cell portion contacting the semiconductor substrate through a second contact hole in the interlayer film. The first surface electrode is electrically coupled with the second surface electrode. A resistivity of the first surface electrode is higher than the second surface electrode.

In the above device, the contact resistance between the semiconductor substrate and the first surface electrode is higher than the contact resistance between the semiconductor substrate and the second surface electrode. Thus, the hole concentration in the removal portion is restricted.

According to a third aspect of the present disclosure, a method of manufacturing a semiconductor device includes: forming an element area in a semiconductor substrate; forming an interlayer film on a first surface of the semiconductor substrate having a first conductive type; forming a surface electrode on the interlayer film; forming a surface pad for electrically coupling with an external device on the surface electrode; forming a backside electrode on a second surface of the semiconductor substrate, which is opposite to the first surface; and forming an outer periphery area on an outer periphery of the element area. The forming of the element area includes: forming an element structure on a first surface side of the semiconductor substrate in a cell portion so that the element structure provides a vertical semiconductor element for flowing current between the surface electrode and the backside electrode; and forming a plurality of contact regions on the first surface side of the semiconductor substrate in a removal portion. The removal portion is disposed on an outer periphery of the cell portion. Each contact region has a second conductive type. The forming of the surface electrode includes: forming a plurality of contact holes in the interlayer film in the removal portion; forming an electrode film on the interlayer film in such a manner that each contact hole is filled with the electrode film; and patterning the electrode film and forming a plurality of notches in the electrode film so that the surface electrode is obtained. A part of the electrode film in the removal portion facing each contact region through a corresponding contact hole is defined as a contact portion. Each notch is disposed on a shortest distance line segment between a corresponding contact portion and the surface pad.

In the above method, the hole flowing into the surface electrode via the contact hole in the removal portion flows into the surface pad to bypass the notch. Accordingly, the distance of the hole path from the contact portion to the surface pad increases, compared with a case where the device has no notch. Thus, the resistance of the hole path increases, and therefore, the hole does not easily flows into the contact region. Thus, even if the impurity concentrations of the contact regions are varied, the hole concentration at a specific contact region is restricted. Thus, the recovery withstand of the device is stably obtained.

According to a fourth aspect of the present disclosure, a method of manufacturing a semiconductor device includes: forming an element area in a semiconductor substrate; forming an interlayer film on a first surface of the semiconductor substrate having a first conductive type; forming a surface electrode on the interlayer film; forming a surface pad for electrically coupling with an external device on the surface electrode; forming a backside electrode on a second surface of the semiconductor substrate, which is opposite to the first surface; and forming an outer periphery area on an outer periphery of the element area. The forming of the element area includes: forming an element structure on a first surface side of the semiconductor substrate in a cell portion so that the element structure provides a vertical semiconductor element for flowing current between the surface electrode and the backside electrode; and forming a plurality of contact regions on the first surface side of the semiconductor substrate in a removal portion. The removal portion is disposed on an outer periphery of the cell portion. Each contact region has a second conductive type. The forming of the surface electrode includes: forming a plurality of first contact holes in the interlayer film in the removal portion; forming a first surface electrode film on the interlayer film in such a manner that each first contact hole is filled with the first surface electrode film; patterning the first surface electrode film and contacting the first surface electrode film on each contact region through a corresponding first contact hole film so that the first surface electrode is obtained; forming a second contact hole in the interlayer film in the cell portion; forming a second surface electrode film on the interlayer film in such a manner that the second contact hole is filled with the second surface electrode film; and patterning the second surface electrode film and contacting the second surface electrode film on the semiconductor substrate through the second contact hole so that the second surface electrode is obtained. A resistivity of the first surface electrode is higher than the second surface electrode.

In the above method, the contact resistance between the semiconductor substrate and the first surface electrode is higher than the contact resistance between the semiconductor substrate and the second surface electrode. Thus, the hole concentration in the removal portion is restricted.

According to a fifth aspect of the present disclosure, a semiconductor device includes: a drift layer having a first conductive type; a channel region having a second conductive type and disposed on the drift layer; a first impurity region having the first conductive type and disposed in a surface portion of the channel region, wherein the first impurity region is spaced a part from the drift layer via the channel region sandwiched therebetween, and has an impurity concentration higher than the drift layer; a gate electrode disposed on a first surface of the channel region via a gate insulation film; a second impurity region having the first or second conductive type and contacting the drift layer, wherein the second impurity region is spaced a part from the channel region, and has an impurity concentration higher than the drift layer; a first electrode electrically coupled with the first impurity region and the channel region; a second electrode electrically coupled with the second impurity region; an element portion including a semiconductor element having an insulation gate structure, wherein the semiconductor element is provided in such a manner that a part of the channel region opposite to the gate electrode via the gate insulation film provides a reverse type channel so that current flows between the first electrode and the second electrode through the channel; and an outer periphery region disposed on an outer periphery of the element portion. The element portion further includes a contact portion, through which the first electrode is electrically coupled with the first impurity region and the channel region. The contact portion extends on the first surface of the channel region. The contact portion includes an end portion and an inner portion. The end portion of the contact portion is disposed on an outer periphery region side, and the inner portion of the contact portion is disposed on an inner side from the end portion. A resistance per unit area in the end portion of the contact portion is higher than the inner portion of the contact portion.

In the above device, since the hole accumulated in the outer periphery region does not easily flow through the end portion of the contact portion, the hole is not concentrated at the end portion of the contact portion when the hole flows from the outer periphery region in case of the recovery. Thus, the hole is not easily concentrated at one point, and therefore, the hole flow from the outer periphery region to the contact portion is unformed. Thus, the sufficient recovery withstand amount is stably obtained.

According to a sixth aspect of the present disclosure, a semiconductor device includes: a drift layer having a first conductive type; first and second channel regions having a second conductive type and disposed in first and second surface portions of the drift layer, respectively, wherein the first channel region is spaced apart from the second channel region; a first impurity region having the first conductive type and disposed in the first channel region, wherein an impurity concentration of the first impurity region is higher than the drift layer; a second impurity region having the first conductive type and disposed in the second channel region, wherein an impurity concentration of the second impurity region is higher than the drift layer; a gate electrode disposed on a first surface of the drift layer via a gate insulation film; a first electrode electrically coupled with the first impurity region; a second electrode electrically coupled with the second impurity region; an element portion including a semiconductor element having an insulation gate structure, wherein the semiconductor element is provided in such a manner that a part of the channel region opposite to the gate electrode via the gate insulation film provides a reverse type channel so that current flows between the first electrode and the second electrode through the channel; and an outer periphery region disposed on an outer periphery of the element portion. The element portion further includes: a first contact portion, through which the first electrode is electrically coupled with the first impurity region and the channel region; and a second contact portion, through which the second electrode is electrically coupled with the second impurity region and the channel region. The first and second contact portions extend on the first surface of the channel region. Each of the first and second contact portions includes an end portion and an inner portion. The end portion of each of the first and second contact portions is disposed on an outer periphery region side, and the inner portion of each of the first and second contact portions is disposed on an inner side from a corresponding end portion. A resistance per unit area in the end portion of each of the first and second contact portions is higher than the inner portion of a corresponding contact portion.

In the above device, since the hole accumulated in the outer periphery region does not easily flow through the end portion of the contact portion, the hole is not concentrated at the end portion of the contact portion when the hole flows from the outer periphery region in case of the recovery. Thus, the sufficient recovery withstand amount is stably obtained.

BRIEF DESCRIPTION OF THE DRAWINGS

The above and other objects, features and advantages of the present invention will become more apparent from the following detailed description made with reference to the accompanying drawings. In the drawings:

FIG. 13 is a diagram showing a cross sectional view of a semiconductor chip as a semiconductor device according to an eighth embodiment;

DETAILED DESCRIPTION

First Embodiment

Figure 1:
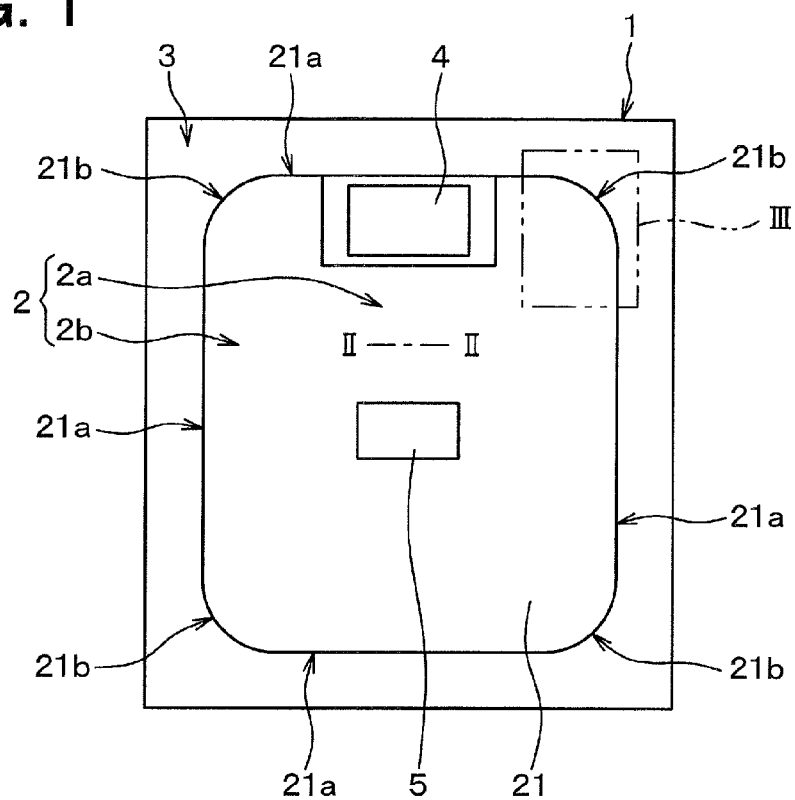
FIG. 1 is a diagram showing a semiconductor chip as a semiconductor device according to a first embodiment.

A semiconductor chip 1 as a semiconductor device according to a first embodiment is shown in FIG. 1.

As shown in FIG. 1, the semiconductor chip 1 has a rectangular shape. The chip 1 includes an element portion 2 and an outer periphery region 3. A semiconductor element is formed in the element portion 2. The outer periphery region 3 is disposed on the outside of the element portion 2. A wiring of the semiconductor element is arranged on the outer periphery region 3. The chip 1 further includes a gate pad 4 and a source pad 5, which is disposed on one side of the chip 1. Further, the chip 1 includes a drain pad, which is disposed on the other side of the chip 1.

Figure 2:
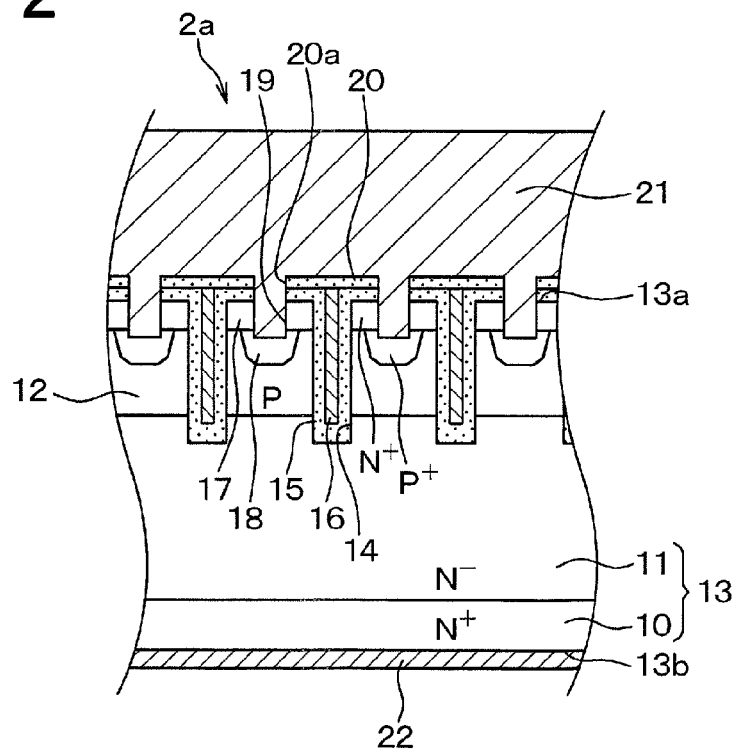
FIG. 2 is a diagram showing a cross sectional view of the semiconductor device taken along line II-II in FIG. 1.

The element portion 2 includes a cell portion 2a and a removal portion 2b. The semiconductor element is formed in the cell portion 2a. The removal portion 2b is disposed on the outside of the cell portion 2a so that the removal portion 2b surrounds the cell portion 2a. In the present embodiment, a trench gate type DMOSFET as the semiconductor element is formed in the cell portion 2a. The structure of the DMOSFET will be explained as follows. FIG. 2 is a cross sectional view of the semiconductor device taken along line II-II in FIG. 1.

As shown in FIG. 2, the DMOSFET is formed in a support substrate 10 having a N+ conductive type. A drift layer 11 having the N− conductive type is formed on a principal surface of the support substrate 10. The drift layer 11 is formed by an epitaxial growth method or the like. The impurity concentration of the drift layer 11 is lower than the support substrate 10. A channel region 12 having the P conductive type is formed in a surface portion of the drift layer 11. The channel region 12 has a predetermined depth.

In the present embodiment, the support substrate 10 and the drift layer 11 provide a semiconductor substrate 13. A surface of the drift layer 11, i.e., a surface of the channel region 12 provides one surface 13a as a first surface of the semiconductor substrate 13. A surface opposite to the one surface 13a, i.e., a surface of the support substrate 10 opposite to the drift layer 11 provides the other surface 13b as a second surface of the semiconductor substrate 13.

Multiple trenches 14 are formed to penetrate the channel region 12 and to reach the drift layer 11. The trench 14 provides a trench gate structure. In the present embodiment, the trenches 14 are formed in parallel to each other along with a longitudinal direction of the semiconductor chip 1 at predetermined regular intervals.

A gate insulation film 15 and a gate electrode 16 are formed in each trench 14. The gate insulation film 15 covers an inner wall of the trench 14. The gate electrode made of poly silicon or the like is formed on the gate insulation film 15. Thus, the trench 14, the gate insulation film 15 and the gate electrode 16 provide the trench gate structure. Here, the gate electrode 16 is connected to a gate pad 4 via a wiring (not shown).

A source region 17 having the N+ conductive type is formed in a surface portion of the channel region 12. The source region 17 has an impurity concentration higher than the drift layer 11. The source region 17 terminates in the cell portion 2a. Further, the source region 17 contacts a sidewall of the trench 14. In the present embodiment, the gate insulation film 15 covers the surface of the source region 17.

Further, a body region 18 having the P+ conductive type is formed in a surface portion of the channel region 12. The body region 18 is spaced apart from the sidewall of the trench 14. The body region 18 provides a part of the channel region 12 for contact. The body region 18 has an impurity concentration higher than the channel region 12. Further, the body region 18 is deeper than the source region 17. The body region 18 terminates in the cell portion 2a.

A contact trench 19 is formed between adjacent two trenches 14. The contact trench 19 is shallower than the trench 14. Further, the contact trench 19 penetrates the source region 17 so that the body region 18 (i.e., the channel region 12) is exposed on the bottom of the contact trench 19. In the present embodiment, the body region 18 is deeper than the bottom of the contact trench 19. Alternatively, the bottom of the contact trench 19 may be deeper than the body region 18, so that the body region 18 is arranged on the sidewall of the contact trench 19. In this case, the channel region 12 is exposed on the bottom of the trench 14.

In the above structure, an interlayer film 20 made of a BPSG film is formed on the gate insulation film 15 and the gate electrode 16 exposed from the gate insulation film 15. A contact hole 20a is formed on a part of the interlayer film 20, which faces the contact trench 19.

A source electrode 21 is formed to fill the contact hole 20a of the interlayer film 20 and the contact trench 19. The source electrode 21 is electrically coupled with the source region 17 and the body region 18. The source electrode 21 is electrically coupled with the source pad 5. Further, a drain electrode 22 is formed on the other surface 13b of the semiconductor substrate 13. Thus, the DMOSFET structure of the semiconductor element is obtained according to the present embodiment.

The source electrode 21 according to the present embodiment includes four straight portions 21a and four corner portions 21b, as shown in FIG. 1. Each former portion 21b is chamfered. A part of one shorter straight portion 21a (i.e., an upper shorter side in FIG. 1) is concaved on the one surface 13a. The gate pad 4 is formed in a concaved portion of the source electrode 21. The source pad 5 is disposed at a part of the source electrode 21, which is at the same distance from each corner portion 21b. Specifically, the source pad 5 is disposed at a center of the rectangular shape of the source electrode 21.

An outer periphery structure such as the removal portion 2b disposed on the outer circumference of the cell portion 2a will be explained with reference to FIGS. 3 to 5.

Figure 3:
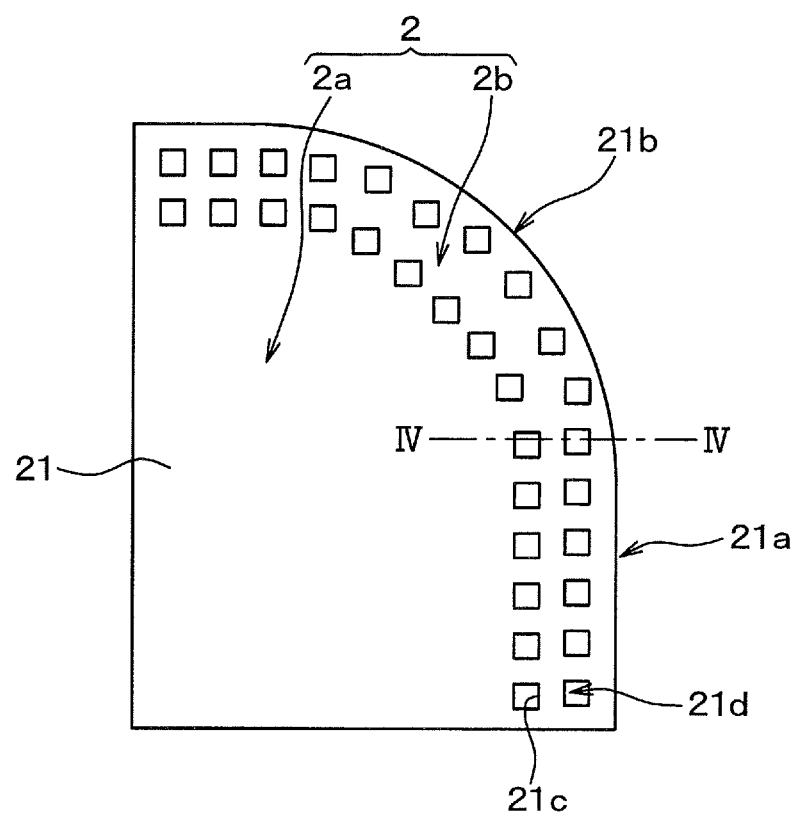
FIG. 3 is a diagram showing a partially enlarged plan view of a part III of the semiconductor device in FIG. 1.

FIG. 3 shows a partially enlarged plan view of a part III of the semiconductor device in FIG. 1. FIG. 4 shows a cross sectional view of the semiconductor device taken along line IV-IV in FIG. 3. In FIG. 3, the outer periphery region 3 is not shown. As shown in FIGS. 3 and 4, the channel region 12 extends from the cell portion 2a to the removal portion 2b. Multiple contact regions 23 having the P+ conductive type are formed in a surface portion of the channel region 12 in the removal portion 2b. The contact regions 23 are separated from each other, and arranged along with an outer circumference of the source electrode 21. Each contact region 23 is electrically coupled with the source electrode 21 through the contact hole 20b, which is formed at a part of the interlayer film 20 facing the contact region 23.

A diode is formed in the removal portion 2b. The diode has a PN junction, which is provided by the drift layer 11 having the N− conductive type and the channel region 12 having the P conductive type. The diode is disposed between the source electrode 21 and the drain electrode 22. The diode functions as a withstand region of the cell portion 2a. The contact region 23 has an impurity concentration substantially equal to the body region 18.

Multiple notches 21c for exposing the interlay film 20 are formed on the outer circumference of the source electrode 21. The notch 21c will be explained as follows. Here, a part of the source electrode 21 facing the contact region 23, which is exposed from the contact hole 20b, is defined as a contact portion 21d. FIG. 5 shows a plan view of the source electrode 21, and shows an arrangement relationship among the source pad 5, the contact portion 21d and the notch 21c.

Figure 5:
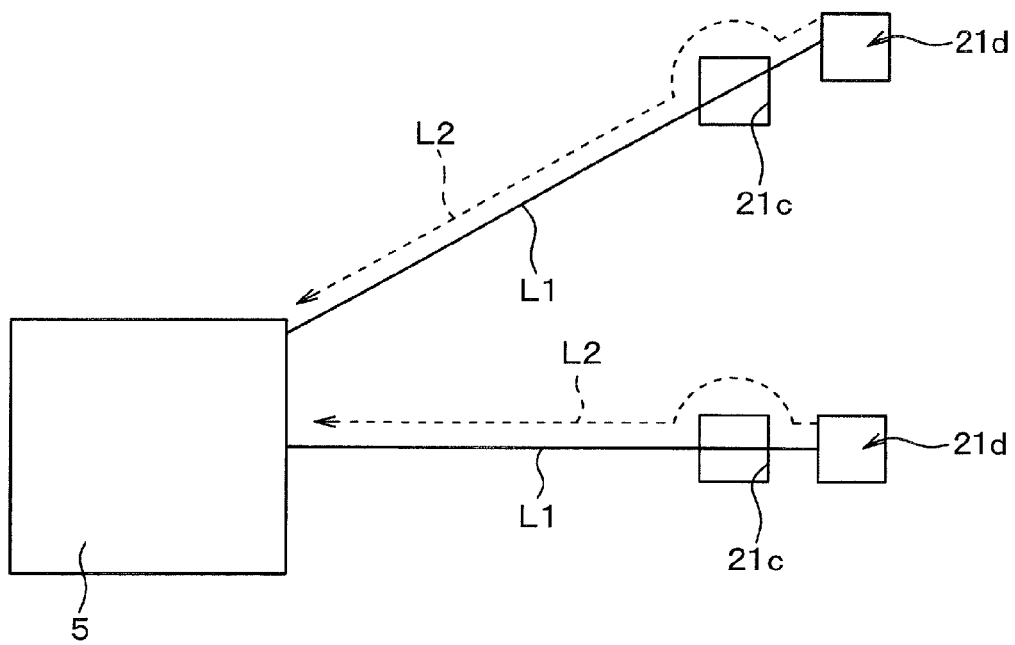
FIG. 5 is a diagram showing an arrangement relationship among a source pad, a contact portion and a notch.

As shown in FIG. 5, the notch 21c is disposed on a line segment L1, which connects between the contact portion 21d and the source pad 5. The line segment L1 provides a shortest distance between the contact portion 21d and the source pad 5. Specifically, the notch 21c interrupts the line segment L1.

A hole retrieved from the contact region 23 to the source electrode 21 through the contact hole 20b flows in a path L2 from the contact portion 21d to the source pad 5. The path L2 bypasses the notch 21c. Accordingly, because of the notch 21c, the path L2 on the source electrode 21 is made long, and therefore, the resistance between the contact portion 21d and the source pad 5 increases.

Figure 4:
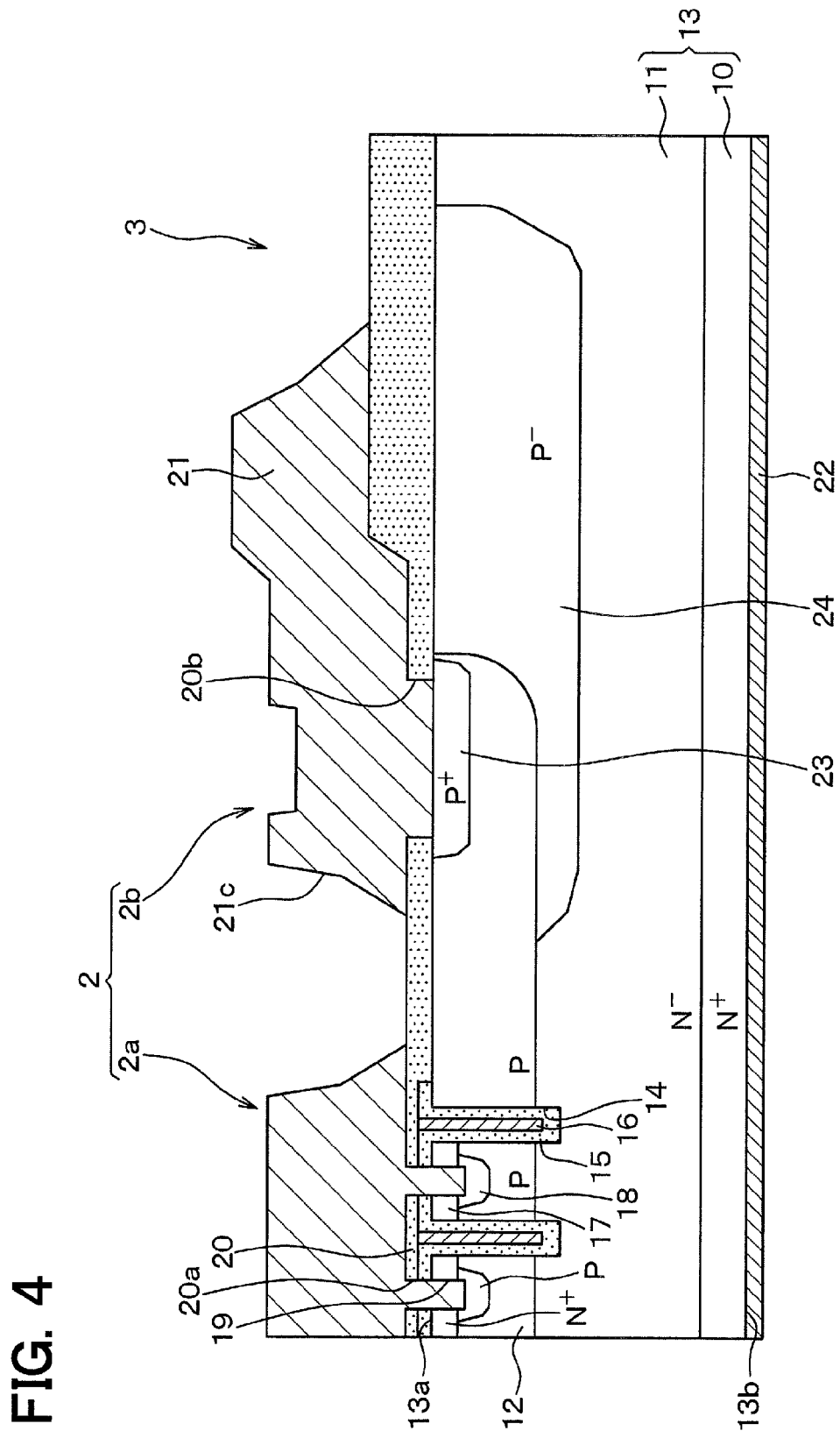
FIG. 4 is a diagram showing a cross sectional view of the semiconductor device taken along line IV-IV in FIG. 3.

As shown in FIG. 4, a RESURF (i.e., reduced surface field) layer 24 having the P− conductive type is disposed from an outer circumference of the removal portion 2b to the outer periphery region 3. The RESURF layer 24 partially overlaps the channel region 12. The interlayer film 20 has the thickness at a portion from the outer circumference of the removal portion 2b toward the outer periphery region 3, which is thicker than other portions of the interlayer film 20. Thus, the interlayer film 20 restricts electric field concentration.

Figure 6A:
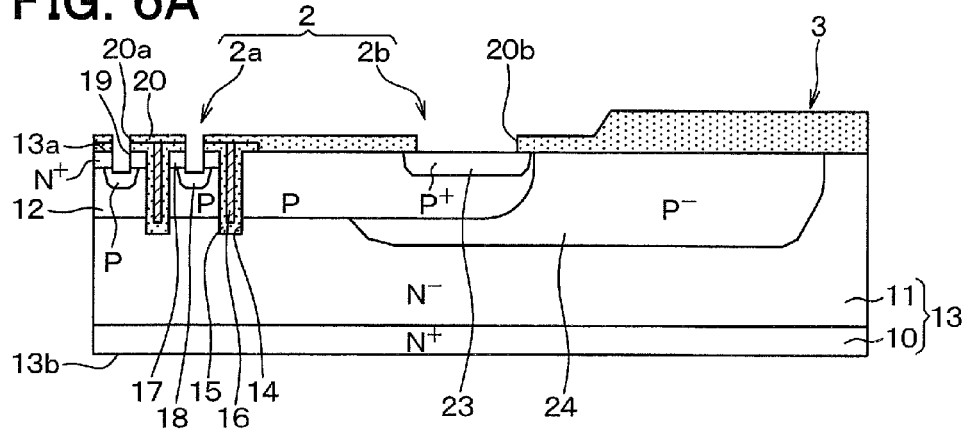
FIGS. 6A to 6C are diagrams showing a manufacturing method of the semiconductor device in FIG. 1.
Figure 6B:
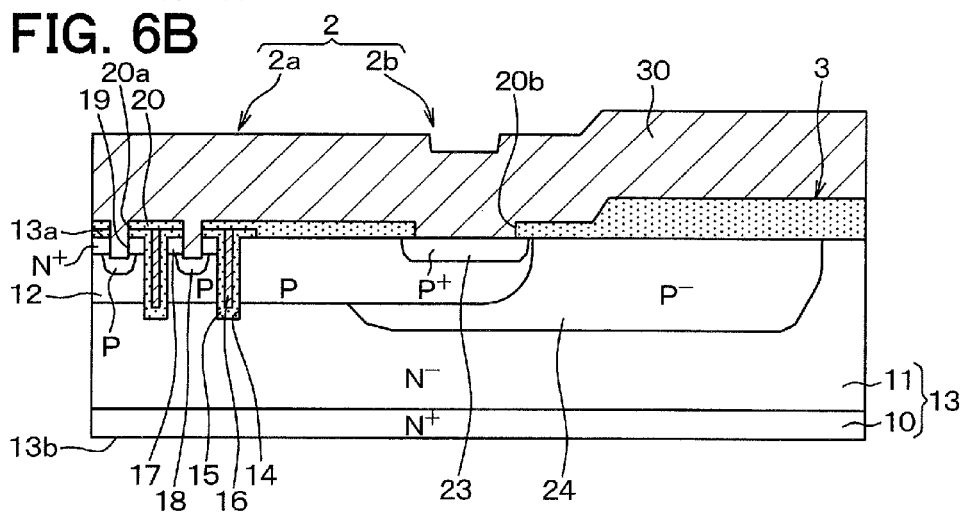
Figure 6C:
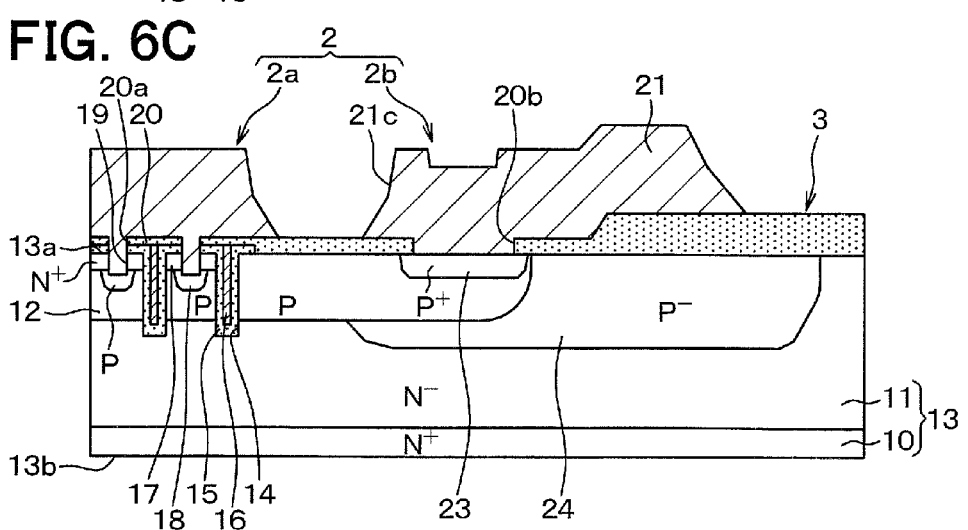

Next, a manufacturing method of the semiconductor chip 1 will be explained. FIGS. 6A to 6C show the manufacturing method of the semiconductor chip 1 in FIG. 1.

As shown in FIG. 6A, the support substrate 10 having the N+ conductive type is prepared. The drift layer 11 having the N− conductive type is formed on the surface of the support substrate 10 by an epitaxial growth method. An ion is implanted in a surface portion of the drift layer 11, and the implanted ion is thermally diffused so that the channel region 12, the source region 17, the body region 18, the contact region 23 and the RESURF layer 24 are formed. After that, the trench 14 is formed on the semiconductor substrate 13 in the element portion 2 such that the trench 14 penetrates the channel region 12 and reaches the drift layer 11. Next, the inner wall of the trench 14 is thermally oxidized in an oxygen atmosphere so that the gate insulation film 15 is formed on the inner wall of the trench 14. A poly silicon film is formed on the gate insulation film 15 by a CVD method or the like. The poly silicon film provides the gate electrode 16. Then, an unnecessary part of the poly silicon film on the gate insulation film 15 is removed, and the interlayer film 20 is formed on the gate insulation film 15 by the CVD method or the like. The interlayer film 20 covers the gate electrode 16. The contact holes 20a, 20b are formed in the interlayer film 20 by a photo lithography and etching method, and the contact trench 19 is also formed.

As shown in FIG. 6B, a source electrode film 30 made of aluminum or the like is formed on the one surface 13a of the semiconductor substrate 13 by a sputtering method or the like such that the source electrode film 30 fills the contact hole 20a and the contact trench 19. Next, as shown in FIG. 6C, the source electrode film 30 is patterned to have a predetermined shape by the photo lithography and etching method. The notch 21c is formed on the line segment connecting between the contact-region-to-be-formed portion and the source-pad-to-be-formed portion. Thus, the source electrode 21 is formed.

Then, the gate pad 4 and the source pad 5 are formed, and further, the drain electrode 22 and the drain pad are formed on the other surface 13b of the semiconductor substrate 13. Thus, the semiconductor chip 1 is manufactured.

In the semiconductor chip 1, when a built-in diode in the DMOSFET is energized, the hole flows from the body region 18 to the drift layer 11, so that the hole is accumulated in the drift layer 11. Then, when the DMOSFET turns on, the hole flowing into the drift layer 11 flows back to the body region 18 and the contact region 23. This flow back hole provides a recovery current.

In the present embodiment, the notch 21c is formed in the source electrode 21 on the line segment L1 between the contact portion 21d and the source pad 5. Accordingly, compared with a case where a conventional semiconductor chip has no notch 21c, the length of the path from the contact portion 21d to the source pad 5 becomes large, and therefore, the resistance between the contact portion 21d and the source pad 5 increases. Accordingly, the hole accumulated in the outer periphery region 3 does not easily flow from the region 3 to the source electrode 21 via the contact region 23, which is formed in the removal portion 2b, but the hole discharges from the region 3 to the source electrode 21 via the body region 18. Accordingly, even if the impurity concentration of the contact regions 23 is varied, the hole is not concentrated at the specific contact region 23, compared with the conventional semiconductor chip. Thus, the recovery withstand is stably obtained.

Here, the source electrode 21 provides a surface electrode or a first electrode. The drain electrode 22 provides a back electrode or a second electrode. The source pad 5 corresponds to a surface pad. The N conductive type provides a first conductive type, and the p conductive type provides a second conductive type.

Second Embodiment

Figure 7:
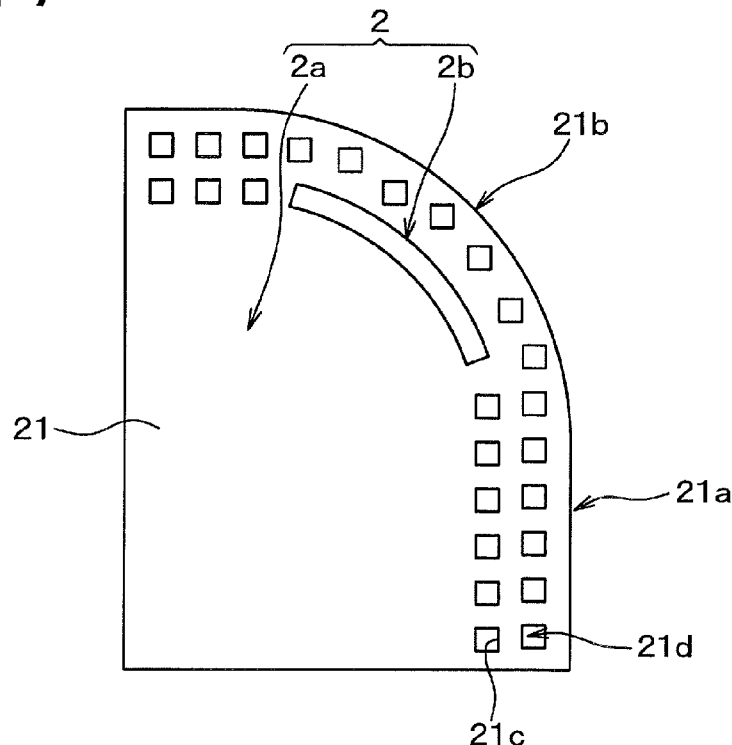
FIG. 7 is a diagram showing a partially enlarged plan view of a semiconductor chip as a semiconductor device according to a second embodiment.

The semiconductor chip 1 according to a second embodiment has the notch 21c disposed around the corner portion 21b on the source electrode 21, which has a different shape from other notches 21c. FIG. 7 shows a partially enlarged plan view of the semiconductor chip 1 as a semiconductor device according to the second embodiment. In FIG. 7, the outer periphery region 3 is not shown.

As shown in FIG. 7, in the present embodiment, the notch 21c disposed on the shortest distance line segment between the source pad 5 and the contact portion 21d along with the straight portion 21a is smaller than the notch 21c disposed on the shortest distance line segment between the source pad 5 and the contact portion 21d along with the corner portion 21b. Specifically, in the present embodiment, the notch 21c in the source electrode 21 along with the corner portion 21b is integrated into one body.

In the semiconductor chip 1, the hole accumulated in the drift layer 11 uniformly flows into the source electrode 21, compared with the chip 1 in FIG. 3. Specifically, in the semiconductor chip 1 in FIG. 1, the hole accumulated in the outer periphery region 3 is easily concentrated at the contact region 23 facing the corner portion 21b of the source electrode 21 and disposed inside of the source electrode 21, compared with the contact region 23 facing the straight portion 21a of the source electrode 21 and disposed inside of the source electrode 21. In the present embodiment, since the notch 21c along with the corner portion 21b is larger than the notch 21c along with the straight portion 21a, the distance between the contact portion 21d disposed around the corner portion 21b and the source pad 5 is long, so that the resistance between the contact portion 21d disposed around the corner portion 21b and the source pad is high. Accordingly, the hole does not easily flows into the contact region 23 facing the corner portion 21b from the outer periphery region 3. Therefore, the hole uniformly flows into the source electrode 21 in case of the recovery.

Third Embodiment

Figure 8:
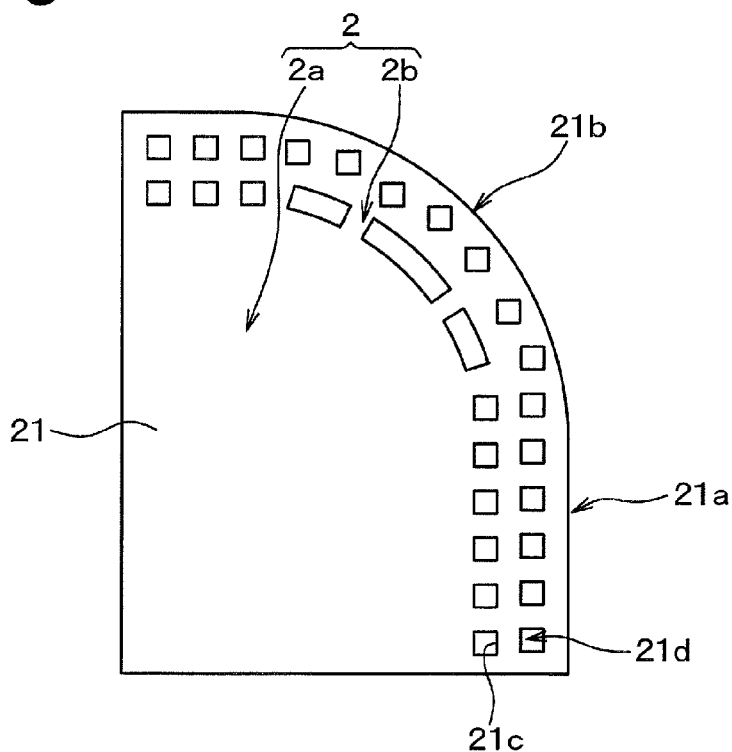
FIG. 8 is a diagram showing a partially enlarged plan view of a semiconductor chip as a semiconductor device according to a third embodiment.

The semiconductor chip 1 according to a third embodiment has the notch 21c disposed around the corner portion 21b on the source electrode 21, which has a different shape from other notches 21c. FIG. 8 shows a partially enlarged plan view of the semiconductor chip 1 as a semiconductor device according to the third embodiment. In FIG. 7, the outer periphery region 3 is not shown.

As shown in FIG. 8, the dimensions of the notches 21c are made larger as it goes from the notch 21c disposed on the shortest distance line segment between the source pad 5 and the contact portion 21d along with the straight portion 21a to the notch 21c disposed on the shortest distance line segment between the source pad 5 and the contact portion 21d, which is arranged at a center among the contact portions 21d around the corner portion 21b. In this semiconductor chip 1, the difference of the resistances between the contact portions 21d and the source pad 5 is reduced. Further, the resistance between the source pad 5 and the contact portion 21d, which is disposed at the center among the contact portions 21d around the corner portion 21b, is maximized. Thus, the variation of the hole flowing from the contact regions 23 to the source electrode 21 is reduced.

Fourth Embodiment

Figure 9:
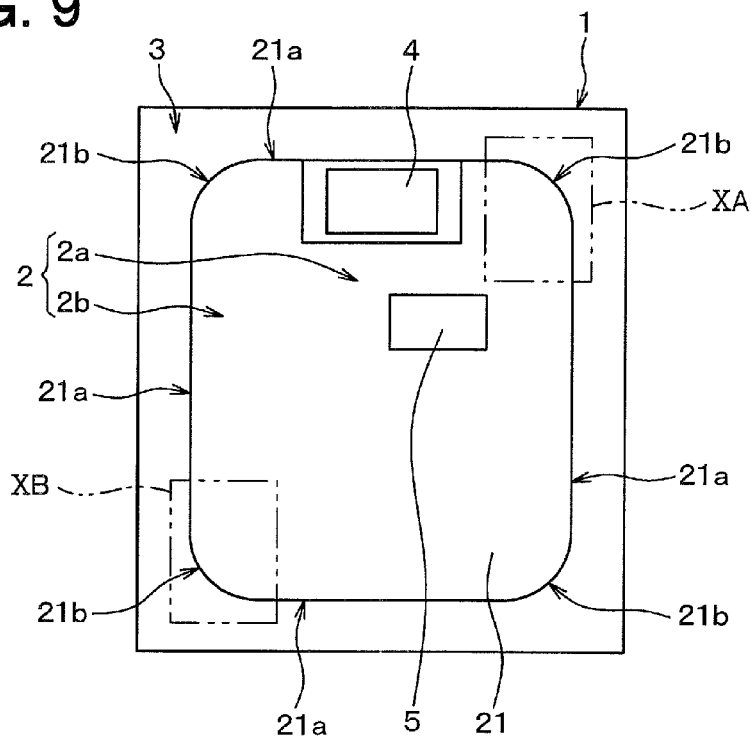
FIG. 9 is a diagram showing a plan view of a semiconductor chip as a semiconductor device according to a fourth embodiment.
Figure 10A:
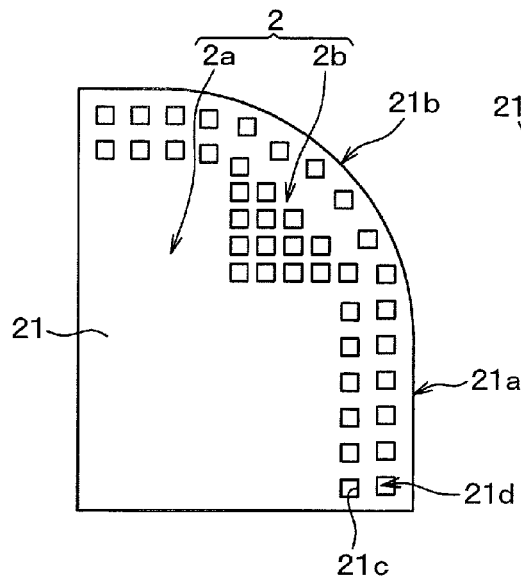
FIG. 10A is a diagram showing a partially enlarged plan view of a part XA of the semiconductor device in FIG. 9.
Figure 10B:
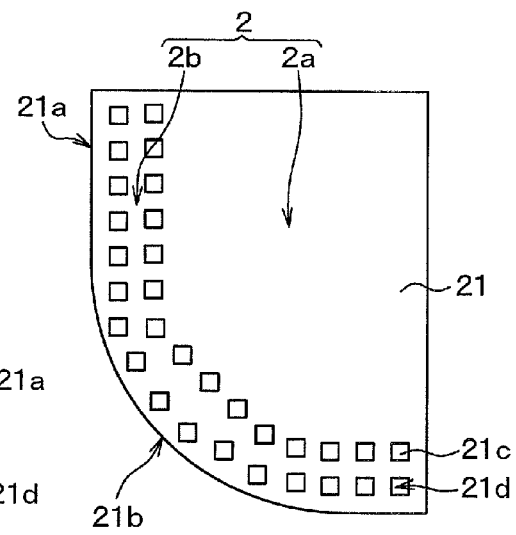
FIG. 10B is a diagram showing a partially enlarged plan view of a part XB of the semiconductor device in FIG. 9.

The semiconductor chip 1 according to a fourth embodiment has the notch 21c disposed around the corner portion 21b on the source electrode 21, which has a different arrangement from other notches 21c. FIG. 9 shows a plan view of the semiconductor chip 1 as a semiconductor device according to the fourth embodiment. FIG. 10A shows a partially enlarged plan view of a part XA of the semiconductor device in FIG. 9, and FIG. 10B shows a partially enlarged plan view of a part XB of the semiconductor device in FIG. 9. In FIGS. 10A and 10B, the outer periphery region 3 is not shown.

As shown in FIG. 9, in the present embodiment, the source pad 5 is not disposed at the same distance from each corner portion 21b. Specifically, the source pad 5 is disposed on an upper right side of the source electrode 21 so that the source pad 5 is disposed near the upper right side corner 21b.

As shown in FIGS. 10A and 10B, the number of the notches 21c between the source pad 5 and the contact portion 21d along with the upper right side corner portion 21b near the source pad 5 is larger than the number of the notches 21c between the source pad 5 and the contact portion 21d along with the lower left side corner portion 21b far from the source pad 5. Specifically, the distance of the path between the source pad 5 and the contact portion 21d along with the upper right side corner portion 21b near the source pad 5 is equal to the distance of the path between the source pad 5 and the contact portion 21d along with the lower left side corner portion 21b far from the source pad 5. Here, the distance includes a manufacturing error, and therefore, the distance of the path between the source pad 5 and the contact portion 21d along with the upper right side corner portion 21b near the source pad 5 may be slightly different by a manufacturing error from the distance of the path between the source pad 5 and the contact portion 21d along with the lower left side corner portion 21b far from the source pad 5.

Although FIGS. 9, 10A and 10B do not show, the distance of the path between the source pad 5 and the contact portion 21d along with the upper left side corner portion 21b is equal to the distance of the path between the source pad 5 and the contact portion 21d along with the lower right side corner portion 21b. Specifically, the number of the notches 21c along with each corner portion 21b corresponds the shortest distance between the source pad 5 and a corresponding contact portion 21d. In the present embodiment, the number of the notches 21c is reduced in the order of the number of the notches 21c between the source pad 5 and the contact portion 21d along with the upper right side corner portion 21b, the number of the notches 21c between the source pad 5 and the contact portion 21d along with the upper left side corner portion 21b, the number of the notches 21c between the source pad 5 and the contact portion 21d along with the lower right side corner portion 21b, and the number of the notches 21c between the source pad 5 and the contact portion 21d along with the lower left side corner portion 21b.

In the above chip 1, although the source pad 5 is not disposed at the at the same distance from each corner portion 21b, the distance of the path between the source pad 5 and each contact portion 21d along with a corresponding corner portion 21b is substantially the same. Thus, the concentration of the hole at the contact region 23 facing a specific corner portion 21b and disposed inside of the source electrode 21 is restricted.

In the present embodiment, the number of the notches 21c is adjusted. Alternatively, the dimensions of the notches 21c may be adjusted so that the distance of the path between the source pad 5 and each contact portion 21d along with a corresponding corner portion 21b is substantially the same.

Fifth Embodiment

The semiconductor chip 1 according to a fifth embodiment has the impurity concentrations of the body region 18 and the contact region 23, which are adjusted. The semiconductor chip 1 has the outer periphery structure, which is the same as the chip in FIG. 4.

In the present embodiment, the impurity concentration of the contact region 23 is lower than the body region 18. Specifically, the resistance of the contact region 23 is higher than the body region 18. Accordingly, in the semiconductor chip 1, the hole accumulated in the outer periphery region 3 does not easily flows into the contact region 23. Thus, the hole concentration at the contact region 23 is restricted.

Sixth Embodiment

Figure 11:
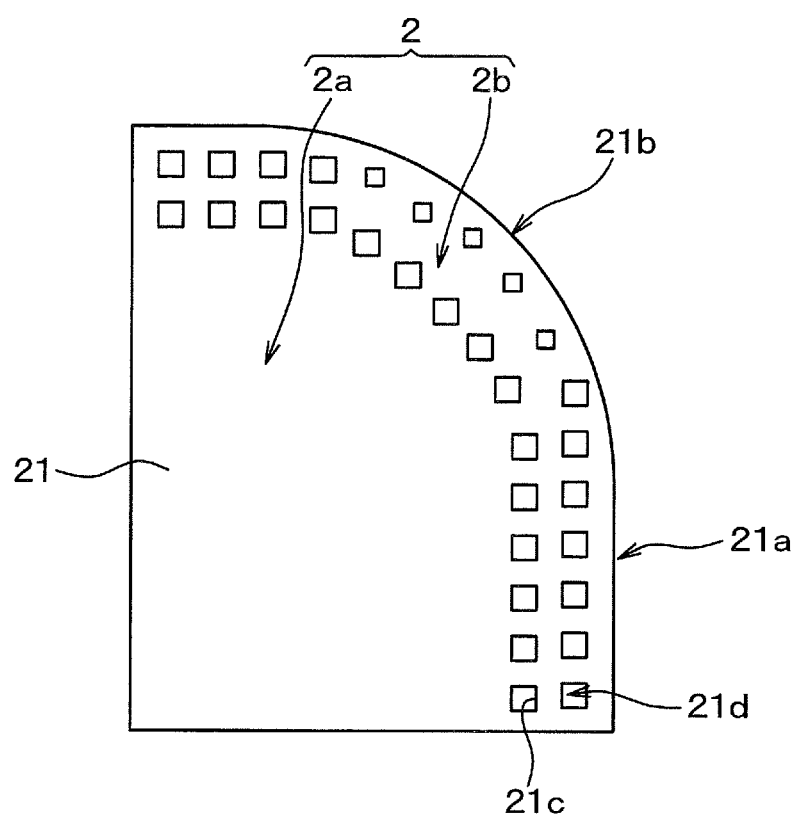
FIG. 11 is a diagram showing a partially enlarged plan view of a semiconductor chip as a semiconductor device according to a sixth embodiment.

The semiconductor chip 1 according to a sixth embodiment has the contact hole 20b along with the corner portion 21b of the source electrode 21, which has a shape different from other contact holes 20b. FIG. 11 shows a partially enlarged plan view of the semiconductor chip 1 as a semiconductor device according to the sixth embodiment.

As shown in FIG. 11, in the present embodiment, the contact portion 21d along with the corner portion 21b has dimensions smaller than the contact portion 21d along with the straight portion 21a. Specifically, the contact hole 20b along with the corner portion 21b is smaller than the contact hole 20b along with the straight portion 21a. Thus, an area of the contact region 23 facing the corner portion 21b, disposed inside of the source electrode 21, and exposed from the contact hole 20b is smaller than an area of the contact region 23 facing the straight portion 21a, disposed inside of the source electrode 21, and exposed from the contact hole 20b.

In the above chip 1, since the contact portion 21d along with the corner portion 21b is smaller than the contact portion 21d along with the straight portion 21a, the hole does not easily flows into the contact portion 21d along with the corner portion 21b. Thus, the hole flows into the source electrode 21 uniformly in case of the recovery.

Seventh Embodiment

Figure 12:
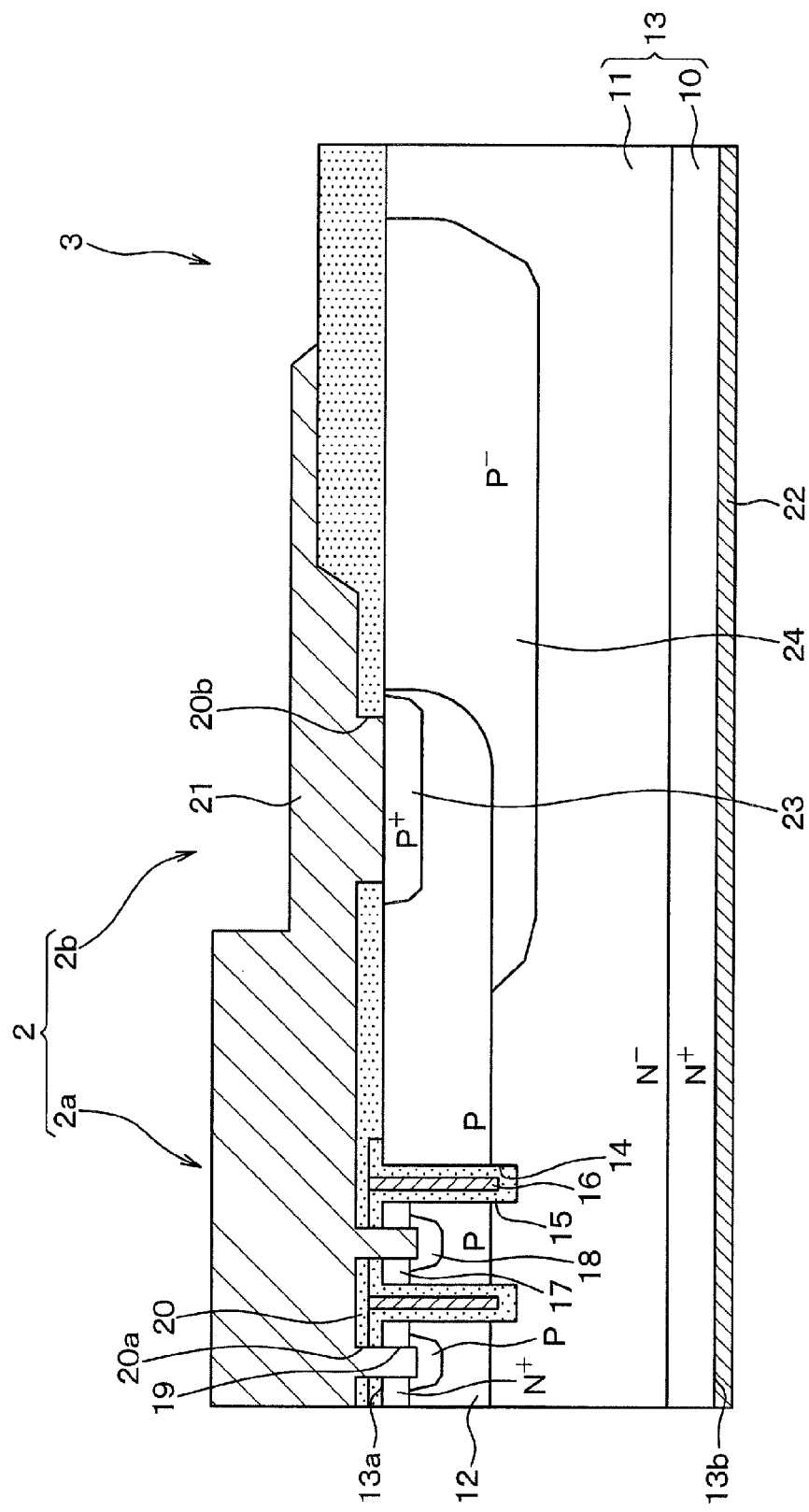
FIG. 12 is a diagram showing a cross sectional view of a semiconductor chip as a semiconductor device according to a seventh embodiment.

The semiconductor chip 1 according to a seventh embodiment has the source electrode 21 with the thickness different from the chip 1 in FIG. 4. FIG. 12 shows a cross sectional view of the semiconductor chip 1 as a semiconductor device according to the seventh embodiment.

As shown in FIG. 12, in the present embodiment, the thickness of the source electrode 21 in the cell portion 2a is larger than the thickness of the source electrode 21 in the removal portion 2b. In this case, since the thickness of the source electrode 21 in the cell portion 2a is larger than the thickness of the source electrode 21 in the removal portion 2b, the resistance of the source electrode 21 in the cell portion 2a is smaller than the resistance of the source electrode 21 in the removal portion 2b. Accordingly, the resistance between the contact portion 21d and the source pad 5 increases, and therefore, the hole is not concentrated at the contact region 23.

In FIG. 12, the source electrode 21 does not include the notch 21c. Alternatively, the source electrode 21 may include the notch 21c, similar to the first to sixth embodiments. When the source electrode 21 includes the notch 21c, the hole concentration at the contact region 23 is restricted.

Eight Embodiment

The semiconductor chip 1 according to an eighth embodiment has a source electrode, which is different from the chip 1 according to the first embodiment. FIG. 13 shows a cross sectional view of the semiconductor chip 1 as a semiconductor device according to the eighth embodiment.

As shown in FIG. 13, the source electrode 21 includes a first source electrode 40 and a second source electrode 41. The first source electrode 40 contacts the contact region 23 through the contact hole 20b. The second source electrode 41 contacts the source region 17 and the body region 18 through the contact hole 20a. The resistivity of the second source electrode 41 is lower than the first source electrode 40. For example, the second source electrode 41 is made of aluminum. The first source electrode 40 is made of TiN, which has a resistivity higher than aluminum. Alternatively, the first source electrode 40 may be made of poly silicon, in which an impurity is doped so as to set the resistivity higher than aluminum. The thickness of the first source electrode 40 is thinner than the second source electrode 41. The first source electrode 40 is electrically coupled with the second source electrode 41.

A manufacturing method of the semiconductor chip 1 will be explained. In the present embodiment, the first source electrode 40 is made of poly silicon. FIGS. 14A to 14C and FIGS. 15A to 15C are diagrams showing the manufacturing method of the semiconductor device in FIG. 13.

Figure 14A:
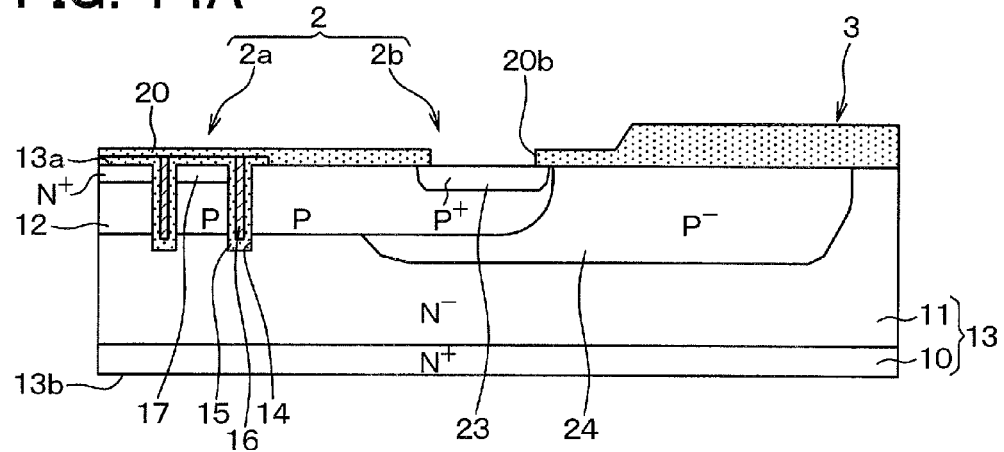
FIGS. 14A to 14C are diagrams showing a manufacturing method of the semiconductor device in FIG. 13.

As shown in FIG. 14A, a step similar to the step in FIG. 6A is executed, so that the trench gate structure including the channel region 12, the source region 17 and the trench 14, the contact region 23 and the RESURF layer 24 are formed. Then, the interlayer film 20 is formed on the one surface 13a. The contact hole 20b is formed in the interlayer film 20 by the photo lithography and etching method.

Figure 14B:
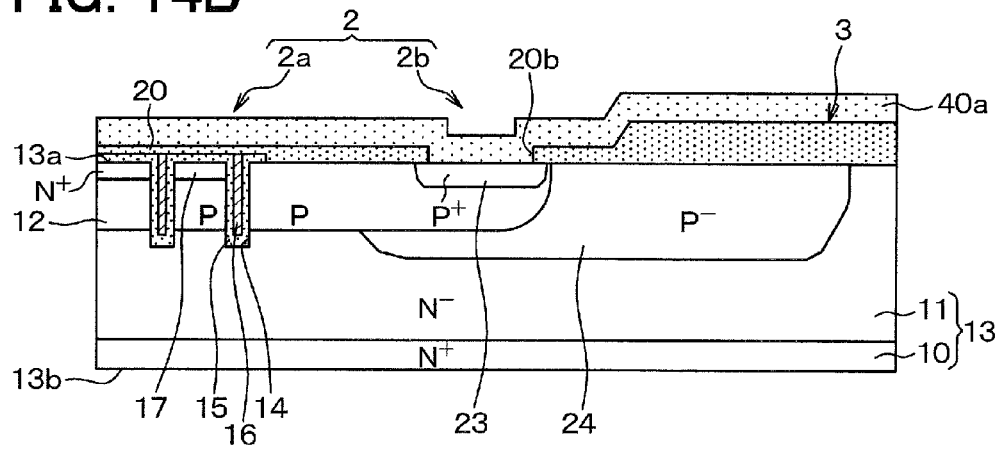
Figure 14C:
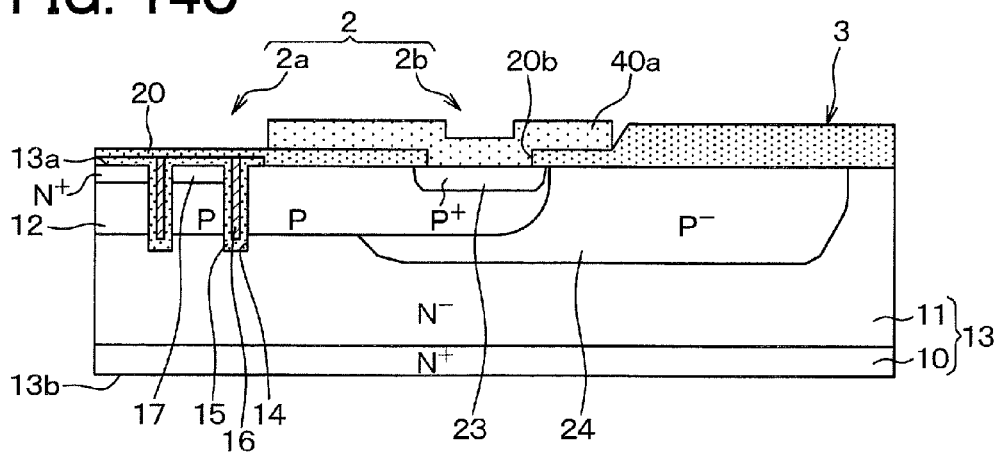

Then, as shown in FIG. 14B, a poly silicon film for providing the first source electrode film 40a is formed on the one surface 13a of the semiconductor substrate 13 to fill the contact hole 20b. Then, as shown in FIG. 14C, the first source electrode film 40a is patterned by the photo lithography and etching method.

Figure 15A:
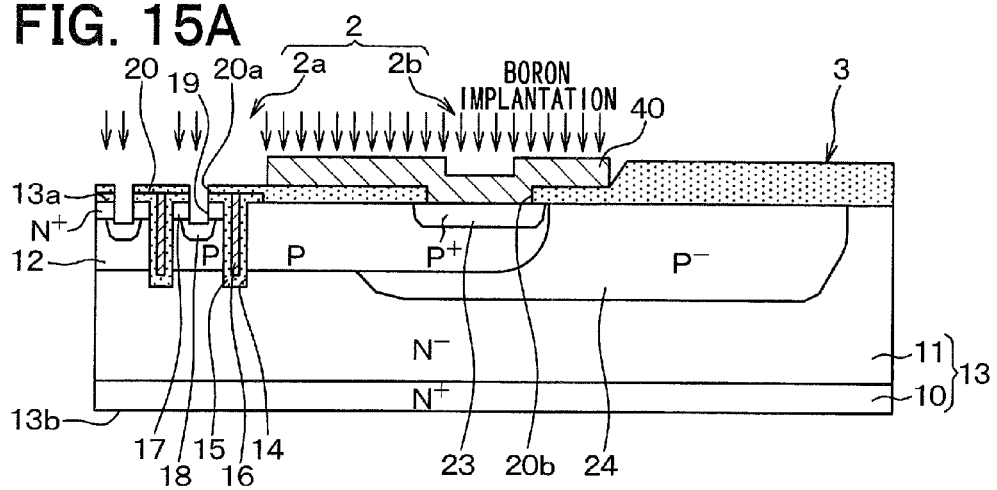
FIGS. 15A to 15C are diagrams showing a manufacturing method of the semiconductor device in FIG. 13.

Then, as shown in FIG. 15A, the interlayer film 20 is processed by the photo lithography and etching method so that the contact hole 20a and the contact trench 19 are formed. Then, an impurity such as boron is implanted in the first source electrode film 40a and on the bottom of the contact trench 19 from the one surface 13a of the semiconductor substrate 13. Then, the implanted impurity is heated so that the first source electrode 40 and the body region 18 are formed at the same time. Here, in the ion implantation step, the dose amount and the like are adjusted so that the first source electrode 40 has a resistivity higher than the second source electrode 41.

Figure 15B:
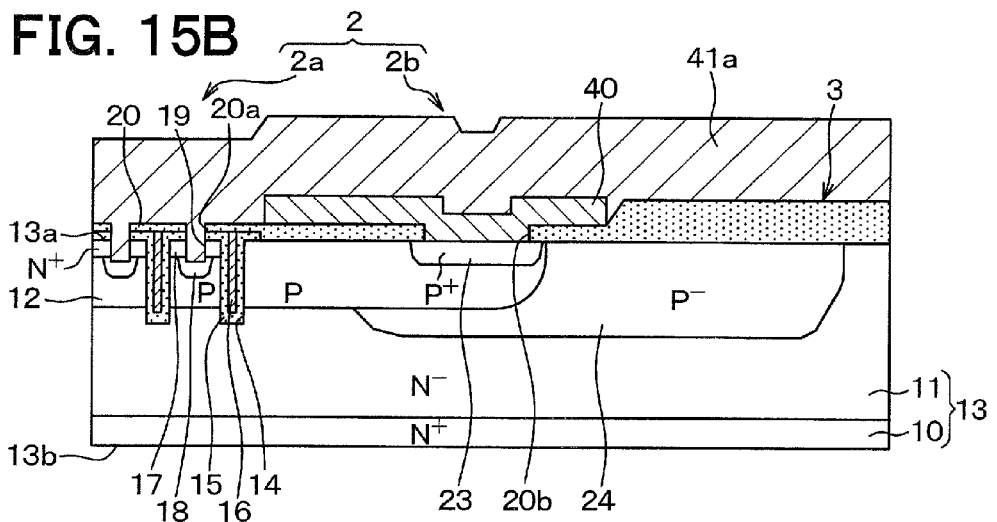
Figure 15C:
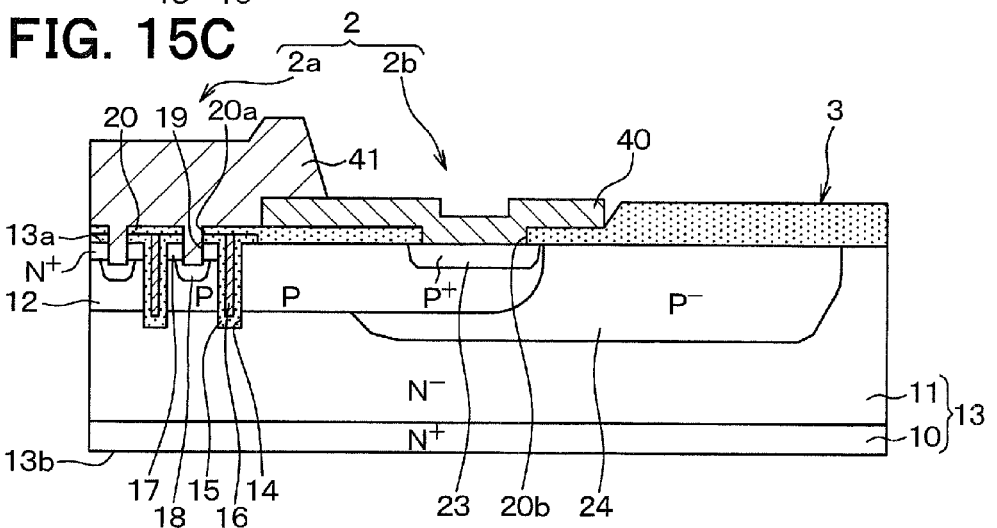

Then, as shown in FIG. 15B, an aluminum film for providing the second source electrode film 41a is formed by the sputtering method or the like to cover the first source electrode 40. Then, as shown in FIG. 15C, the second source electrode film 41a is processed by the photo lithography and etching method so that the second source electrode 41 is formed. Then, similar to the first embodiment, the drain electrode 22 and the drain pad are formed. Thus, the semiconductor chip shown in FIG. 13 is completed.

In the semiconductor chip 1, the resistivity of the first source electrode 40 contacting the contact region 23 is higher than the second source electrode 41 contacting the body region. Accordingly, the contact resistance between the contact region 23 and the second electrode 41 is higher than the contact resistance between the body region 18 and the first source electrode 40. Accordingly, the hole concentration at the contact region 23 is restricted. Further, since the thickness of the first source electrode 40 is thinner than the second source electrode 41, the hole concentration at the contact region 23 is much restricted, compared with a case where the thickness of the first source electrode 40 is equal to the second source electrode 41.

In FIGS. 13 to 15C, the source electrode 21 does not include the notch 21c. Alternatively, similar to the first to sixth embodiment, the source electrode 21 may include the notch 21c. When the source electrode 21 includes the notch 21c, the hole concentration at the contact region 23 is further restricted. Alternatively, the thickness of the first source electrode 40 may be equal to the second source electrode 41. Even in this case, since the resistivity of the first source electrode 40 is higher than the second source electrode 41, the hole concentration at the contact region 23 is restricted.

Modifications

In the above embodiments, the semiconductor element is the DMOSFET, which is formed in the cell portion 2a. Alternatively, the semiconductor element in the cell portion 2a may be an IGBT or the like. Further, the semiconductor element may be a trench gate type device or a planar type device.

In the above embodiments, the source electrode 21 has the rectangular shape with four rounded corner portions 21b. Alternatively, the source electrode 21 may have the rectangular shape with four right-angle corner portions 21.

In the above embodiment, the contact trench 19 is formed between tow adjacent trenches 14. Alternatively, the semiconductor element may not include the contact trench 19. In this case, for example, the body region 18 sandwiched between the source region 17 is formed in a surface portion of the channel region 12. Further, the contact hole 20a is formed such that a part of the surface of the source region 17 and the surface of the body region 18 are exposed in the contact hole 20a. Then, the source electrode 21 is electrically connected to the source region 17 and the body region 18 through the contact hole 20a.

Figure 16:
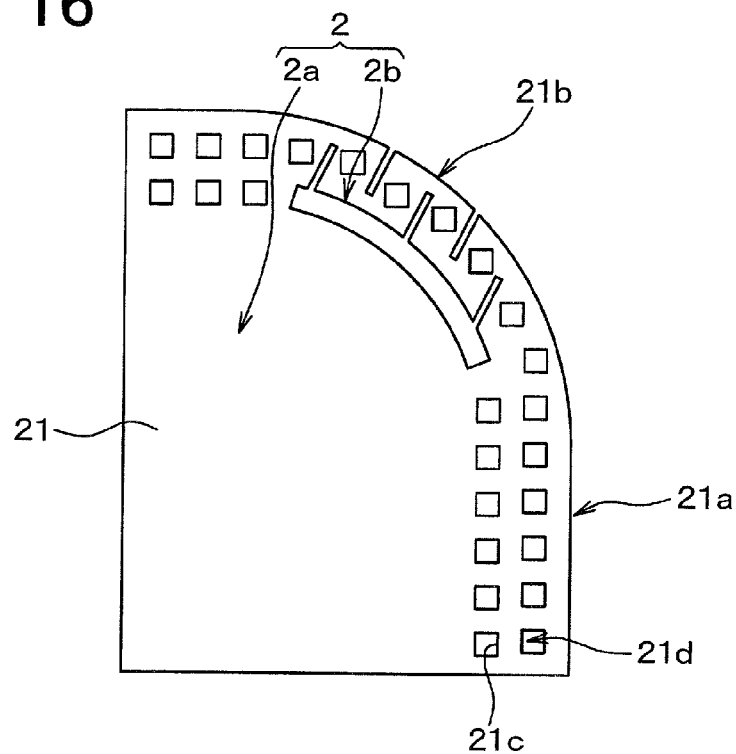
FIG. 16 is a diagram showing a partially enlarged plan view of a semiconductor chip as a semiconductor device according to a modification of the first to ninth embodiments.

In the second embodiment, the dimensions of the notch 21c formed along with the corner portion 21b are larger than the dimensions of the notch 21c formed along with the straight portion 21a. Alternatively, the semiconductor chip 1 may have the structure shown in FIG. 16. FIG. 16 shows a partially enlarged plan view of the semiconductor chip 1 as a semiconductor device according to a modification. As shown in FIG. 16, the notch 21c as a slit may be formed between the contact portions 21d, which are disposed near the corner portion 21b.

The present inventors have studied the reason why the recovery withstand is not obtained stably, and the recovery breakdown occurs in the semiconductor chip. Here, the semiconductor element is a MOSFET.

Figure 30:
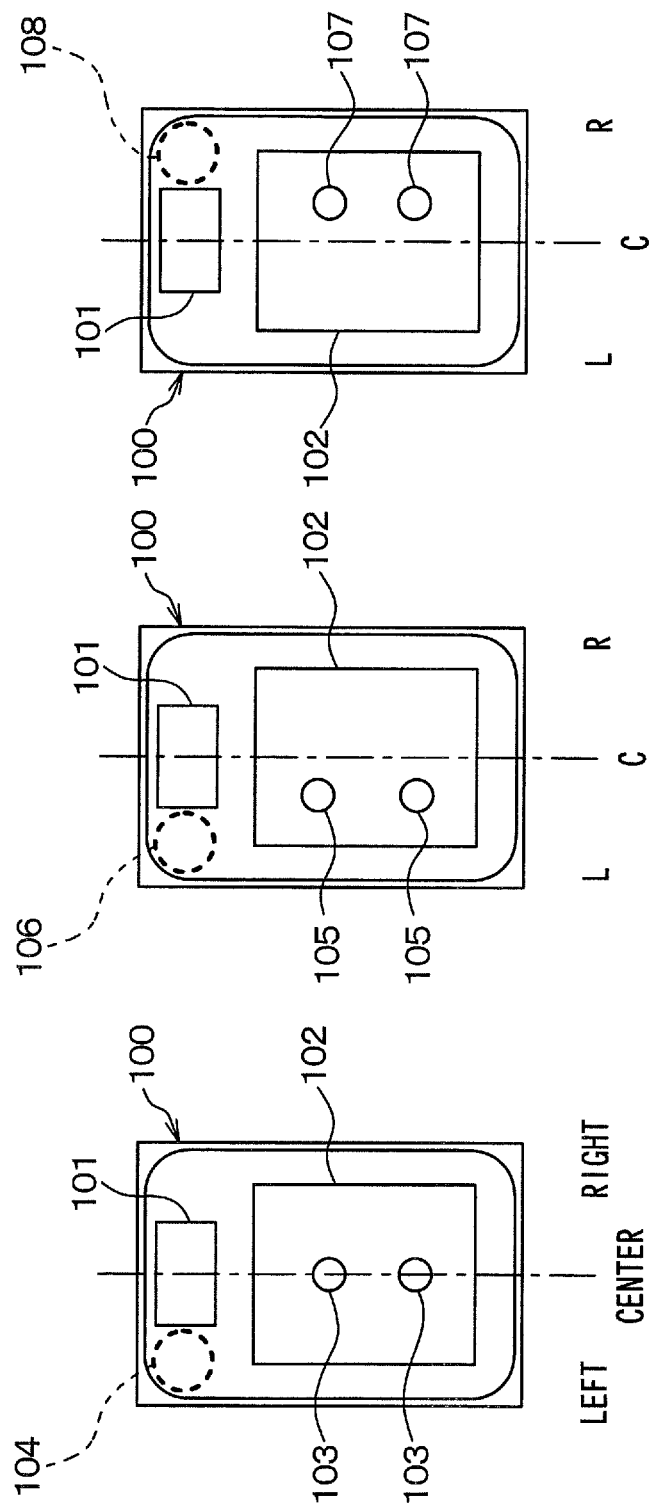
FIGS. 30A to 30C are diagrams showing various break points with respect to various bonding positions of a wire on a semiconductor chip.

FIGS. 30A to 30C show a breakdown point when a wire bonding is performed at various bonding positions on a semiconductor chip. As shown in FIGS. 30a to 30C, the semiconductor chip 100 has a rectangular shape. A gate pad 101 and a source pad 102 are formed on one surface of the chip 100 along with a longitudinal direction (i.e., longer side direction). A wire (not shown) is bonded on the gate pad 101 and the source pad 102. The wire extends along with a latitudinal direction (i.e., shorter side direction) of the chip 100. One wiring is bonded to the gat pad 101. Two wirings are bonded to the source pad 102. Here, a drain pad (not shown) is formed on a backside of the chip 100.

In FIG. 30A, two bonding positions 103 on the source pad 102 are disposed on a center line of the chip 100 in the latitudinal direction. In this case, the recovery withstand amount is 33 amperes. Thus, the recovery withstand amount is stably obtained. The breakdown position 104 of the recovery breakdown is near a corner portion on the left side of the gate pad 101 of the chip 100 with respect to the center line of the chip 100 in the latitudinal direction.

In FIG. 30B, two bonding positions 105 on the source pad 102 are disposed on a left side of the center line of the chip 100 in the latitudinal direction. In this case, the recovery withstand amount is 21 amperes. The recovery withstand amount of this case is lower than the bonding positions 103 in FIG. 30A. The breakdown position 106 of the recovery breakdown is near a corner portion on the left side of the gate pad 101 of the chip 100 with respect to the center line of the chip 100 in the latitudinal direction.

In FIG. 30C, two bonding positions 107 on the source pad 102 are disposed on a right side of the center line of the chip 100 in the latitudinal direction. In this case, the recovery withstand amount is 23 amperes. The recovery withstand amount of this case is lower than the bonding positions 103 in FIG. 30A. The breakdown position 108 of the recovery breakdown is near a corner portion on the right side of the gate pad 101 of the chip 100 with respect to the center line of the chip 100 in the latitudinal direction.

As shown in FIGS. 30B and 30C, when the bonding positions 105, 107 shift from the center line of the chip 100 in the latitudinal direction, the recovery withstand amount is largely reduced. Here, in FIG. 26A, the bonding position 103 is disposed on the center line of the chip 100 in the latitudinal direction. It is considered that the breakdown position 104 is disposed on the left side of the gate pad 101 because the bonding positions 103 slightly shift from the center line to the left side according to variation of the bonding positions.

Figure 31:
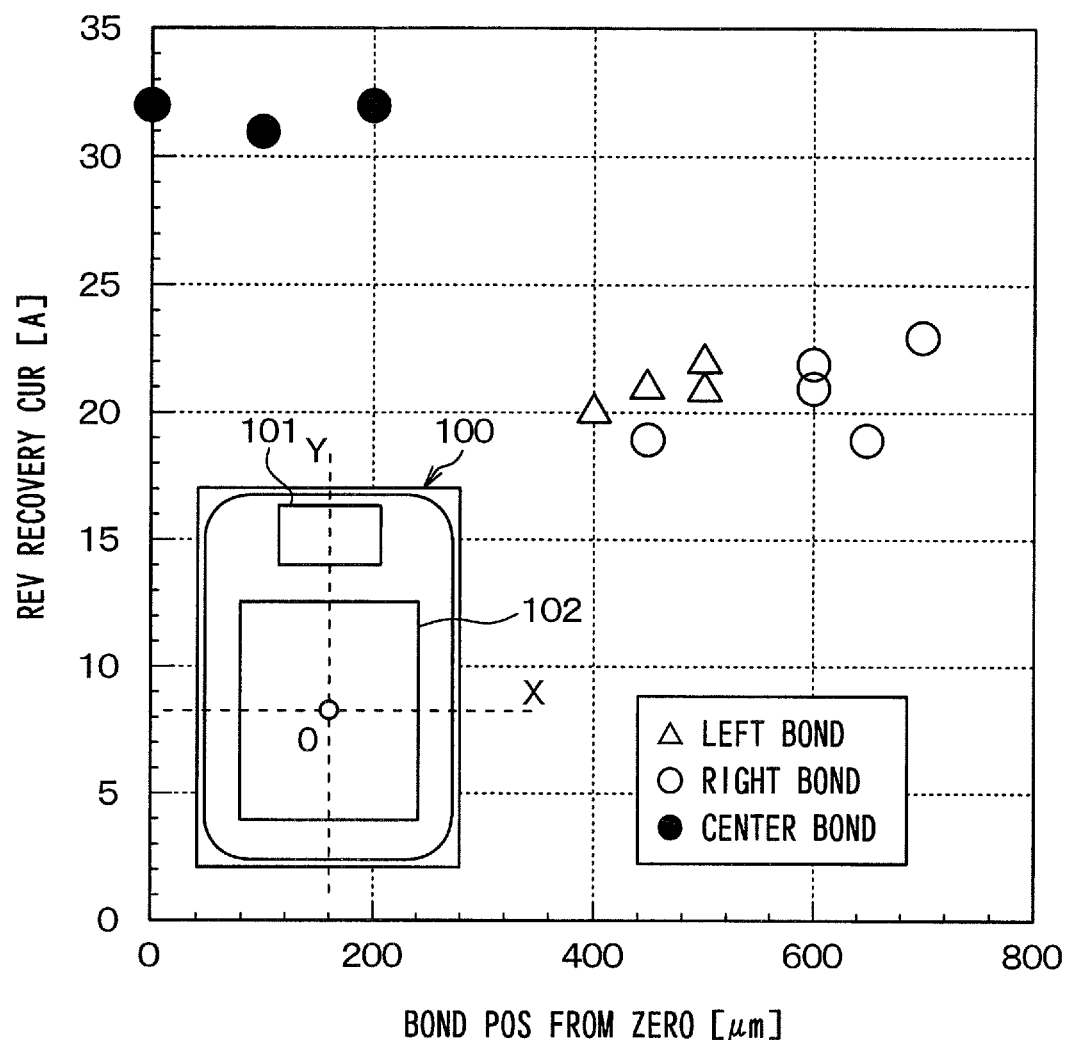
FIG. 31 is a graph showing a relationship between a bonding position and a reverse recovery current at a break down.

The inventors have studied about a relationship between the bonding positions and the recovery withstand amount. FIG. 31 shows a result. As shown in FIG. 31, the point on the center line in the latitudinal direction of the chip 100 is defined as a zero point. The horizontal axis represents the bonding position X from the zero point. The vertical axis represents the reverse recovery current in case of the breakdown. When the reverse recovery current is high, the recovery withstand amount is high.

As shown in FIG. 31, when the bonding position from the zero point is near the zero point, the recovery withstand amount is stably obtained. Specifically, when the bonding position is disposed within a range of 200 micrometers from the center of the source pad 102, the recovery withstand amount is stably obtained. When the bonding position from the zero point is far from the zero point, the recovery withstand amount is small. Specifically, when the bonding position is spaced apart from the center of the source pad 102, the recovery withstand amount is small.

Thus, when the bonding position is far from the center of the chip 100 in the latitudinal direction, the breakdown easily occurs. The breakdown position is disposed near the corner portion of the chip 100. In view of this result, the inventors have executed a simulation experiment about a current density at the breakdown position of the corner portion in the chip 100. The results are shown in FIGS. 32, 33A and 33B.

Figure 32:
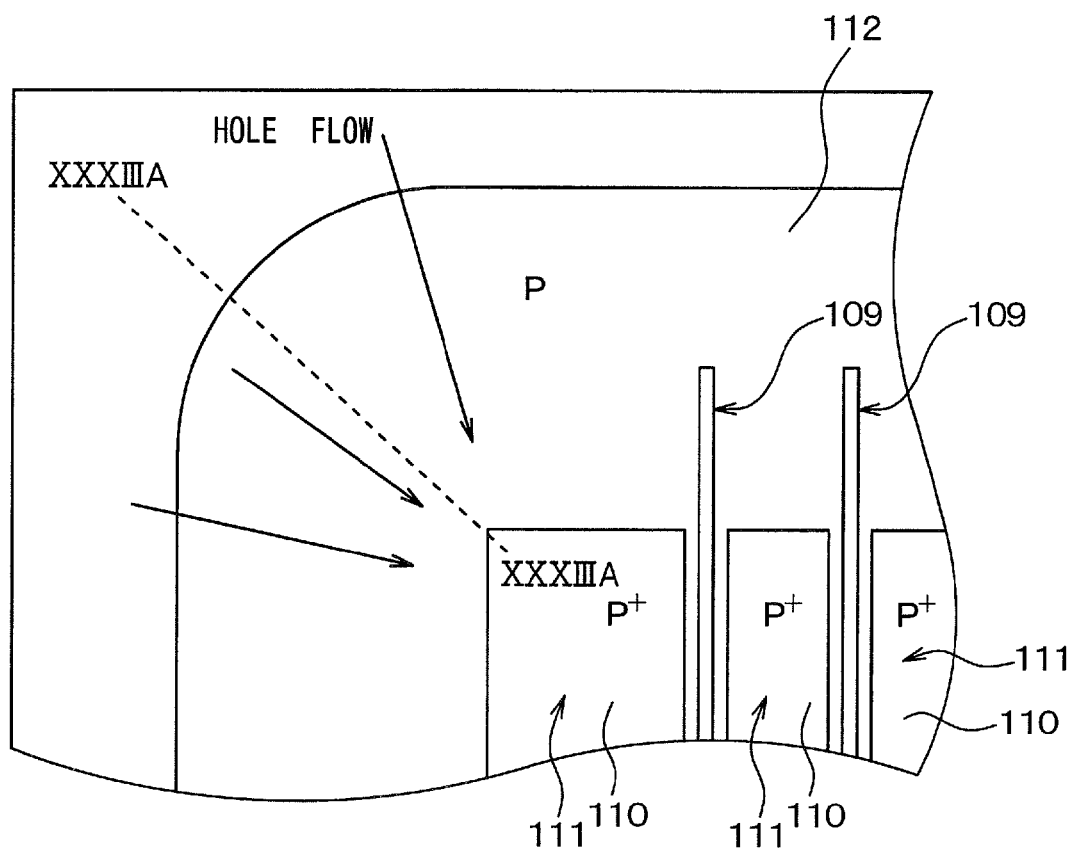
FIG. 32 is a diagram showing a corner portion of a semiconductor chip.

FIG. 32 shows a plan view of the corner portion of the chip 100. FIG. 32 shows a trench gate structure of the MOSFET. A contact 111 is formed to expose a body region 110 having the P+ conductive type. Further, a RESURF (reduced surface field) region 112 as an outer periphery withstand portion having the P conductive type is formed on an outer periphery of the trench gate structure.

Figure 33A:
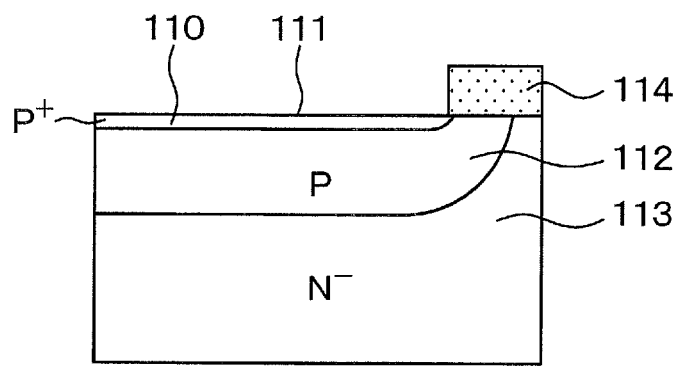
FIG. 33A is a diagram showing a cross sectional view of the chip taken along line XXXIIIA-XXXIIIA in FIG. 32.

FIG. 33A shows a cross sectional view of the chip 100 taken along line XXIXA-XXIXA in FIG. 32. The RESURF layer 112 is formed on the drift layer 113 having the N- conductive type. The contact portion 111 is exposed from an oxide film 114. A source electrode (not shown) is connected to the contact portion 111.

Figure 33B:
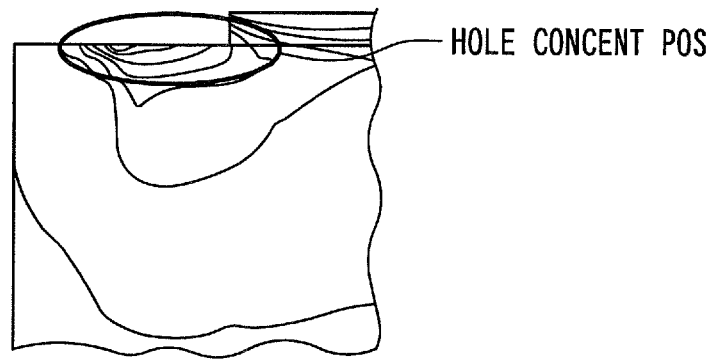
FIG. 33B is a diagram showing a simulation result of a current density.

In the above structure, the simulation result of the current density is shown in FIG. 33B. In FIG. 33B, the current density is shown as a density of lines. As shown in FIG. 33B, the current is concentrated at the surface portion of the body region 110. Specifically, in case of the recovery operation, a residual carrier such as a hole accumulated at the corner portion of the chip 100 and under the gate pad 101 flows into the body region 110 (i.e., a source) at once. Accordingly, the hole flows from the outer periphery region to the contact portion 111 in a shortest distance path.

Actually, in FIGS. 30A to 30C, the breakdown occurs near the corner portion of the semiconductor chip 100, which is disposed on a same side as the bonding position 105, 107 shifting from the center of the source pad 102 of the chip 100 in the longitudinal direction. This is because the distance from the outer periphery region of the chip 100 to the wire connecting to the source pad 102 via the contact portion 111 is the shortest so that a resistance therebetween is the smallest.

Accordingly, it is necessary to bond the wire at the center of the chip 100 in the longitudinal direction in order to maintain the high recovery withstand amount of the chip 100. However, in view of the degree of freedom of the bonding position for the wire, it is preferable to provide stability of the recovery withstand amount even if the wire is bonded to any position of the source pad 102.

Here, in the above case, the semiconductor switching device having the insulation gate structure is the vertical type MOSFET. Even when the semiconductor device is the MOSFET having another structure such as a lateral type MOSFET, a planar type MOSFET and a concave MOSFET, the same difficulty occurs. Further, even when the semiconductor device is a MESFET or a IGBT, the same difficulty occurs.

Thus, the present inventors focus on the feature that the hole flow is concentrated when the path between the outer periphery of the chip and the wire via the contact portion 111 is small. Thus, the present inventors consider that the hole may flow from any point of the outer periphery region via the contact portion 111 when the hole does not easily flow from the outer periphery region of the chip 100 to the contact portion 111.

Ninth Embodiment

Here, the N conductive type, the N− conductive type and the N+ conductive type correspond to a first conductive type, and the P conductive type, the P− conductive type and the P+ conductive type correspond to a second conductive type.

Figure 17:
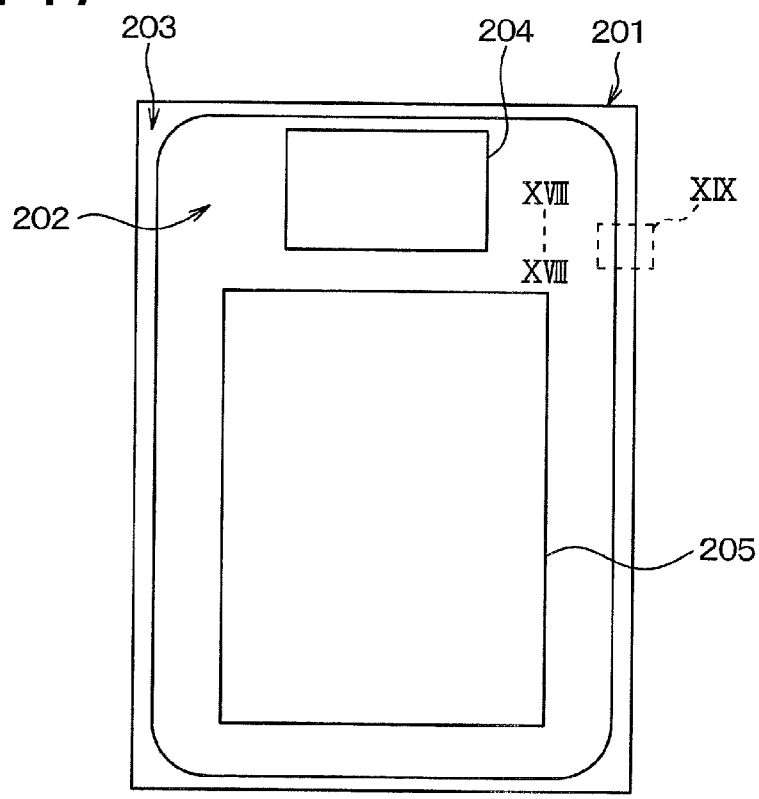
FIG. 17 is a diagram showing a plan view of a semiconductor chip as a semiconductor device according to a ninth embodiment.

FIG. 17 shows a semiconductor chip 201 as a semiconductor device according to a ninth embodiment. As shown in FIG. 17, the chip 201 includes a element portion 202 and an outer periphery region 203 disposed on an outer periphery of the element portion 202. The chip 201 further includes a gate pad 204 and a source pad 205, which is disposed on one side of the chip 201. Further, the chip 201 includes a drain pad, which is disposed on the other side of the chip 201.

The element portion 202 includes a cell portion and a diode region. The semiconductor element is formed in the cell portion. The diode region is disposed on the outside of the cell portion so that the diode region surrounds the cell portion. In the present embodiment, a MOSFET or a MESFET as the semiconductor element is formed in the cell portion. In the present embodiment the semiconductor element is a trench gate type MOSFET.

Figure 18:
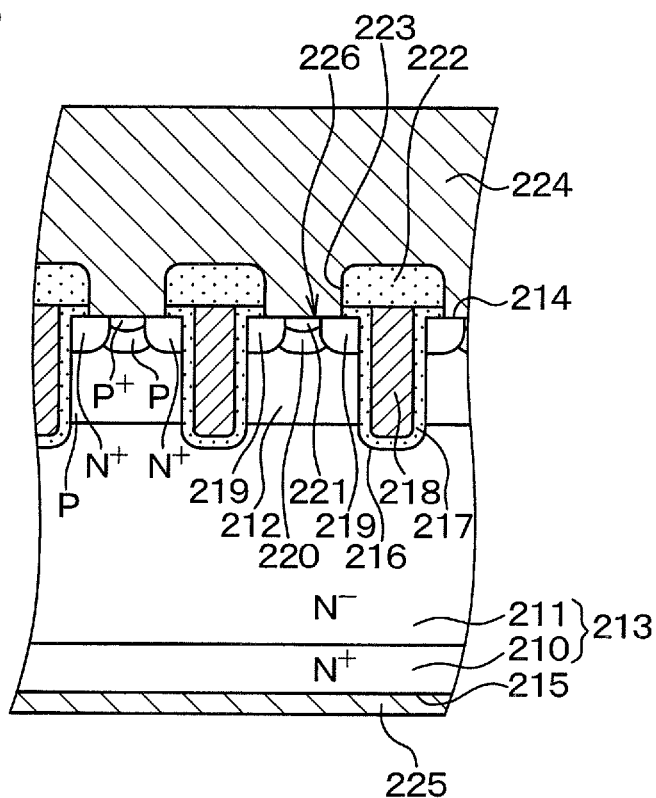
FIG. 18 is a diagram showing a cross sectional view of the chip taken along line XVIII-XVIII in FIG. 17.

The structure of the MOSFET will be explained. FIG. 18 shows a cross sectional view of the chip 201 taken along line XVIII-XVIII in FIG. 17. As shown in FIG. 18, the MOSFET is formed in a support substrate 210 having the N+ conductive type. A drift layer 211 having the N− conductive type is formed on a principal surface of the support substrate 210. The drift layer 211 is formed by an epitaxial growth method or the like. The impurity concentration of the drift layer 211 is lower than the support substrate 210. Thus, the support substrate 210 contacts the drift layer 211, and the impurity concentration of the substrate 210 is higher than the drift layer 211. The substrate 210 is separated from the channel region 212. The channel region 212 having the P conductive type is formed in a surface portion of the drift layer 211. The channel region 212 has a predetermined depth. Thus, the channel region 212 is formed on the drift layer 211.

In the present embodiment, the support substrate 210 and the drift layer 211 provide a semiconductor substrate 213. A surface of the drift layer 211, i.e., a surface of the channel region 212 provides one surface 214 as a first surface of the semiconductor substrate 213. A surface opposite to the one surface 214, i.e., a surface of the support substrate 210 opposite to the drift layer 211 provides the other surface 215 as a second surface of the semiconductor substrate 213.

Multiple trenches 216 are formed to penetrate the channel region 212 and to reach the drift layer 211. In the present embodiment, the trenches 216 are formed in parallel to each other along with a latitudinal direction of the semiconductor chip 201 at predetermined regular intervals.

A gate insulation film 217 and a gate electrode 218 are formed in each trench 216. The gate insulation film 217 covers an inner wall of the trench 216. The gate electrode 218 made of poly silicon or the like is formed on the gate insulation film 217. Thus, the trench 216, the gate insulation film 217 and the gate electrode 218 provide the trench gate structure, i.e., an insulation gate structure. Here, the gate electrode 218 is connected to a gate pad 204 via a wiring (not shown).

A source region 219 having the N+ conductive type is formed in a surface portion of the channel region 212. The source region 219 is spaced apart from the drift layer 211 via the channel region 212 therebetween. The source region 219 has an impurity concentration higher than the drift layer 211. The source region 219 terminates in the cell portion. Further, a part of the source region 219 is covered with the gate insulation film 217 on the one surface 214 of the substrate 213. Thus, the gate electrode 218 is formed on the surface of the channel region 212 between the source region 219 and the drift layer 211 via the gate insulation film 217. In the present embodiment, since the semiconductor element has the trench gate structure, the inner wall of the trench 216 corresponds to the surface of the channel region 212.

Further, a first body region 220 having the P conductive type is formed in a upper portion of the channel region 212. The first body region 220 is sandwiched between the source region 219. A second body region 221 having the P+ conductive type is formed in a surface portion of the first body region 220. The second body region 221 has an impurity concentration higher than the first body region 220.

In the above structure, an interlayer film 222 made of a BPSG film is formed on the gate insulation film 217 and the gate electrode 218 exposed from the gate insulation film 217. A contact hole 223 is formed on a part of the interlayer film 222 and the gate insulation film 217. A part of the source region 219 and the second body region 221 are exposed via the contact hole 223. Thus, the contact hole 223 provides an opening of the interlayer film 222.

A source electrode 224 is formed on the interlayer film 222, and the source electrode 224 is electrically coupled with a part of the source region 219 and the second body region 18 in the channel region 212 through the contact hole 223. Thus, the one surface 214 of the substrate 213 provides a surface on which the source electrode 224 is electrically coupled with the source region 219 and the second body region 221 in the channel region 212. The source electrode 224 is electrically coupled with the source pad 205. Further, a drain electrode 225 is formed on the other surface 215 of the support substrate 210.

Thus, an area of the one surface 214 of the substrate 213 exposed through the contact hole 223 provides the contact portion 216, at which the substrate 213 and the source electrode 224 are electrically coupled with each other. Thus, the element portion 202 includes the contact portion, at which the substrate 213 and the source electrode 224 are electrically coupled with each other. The contact portion 226 is a portion of the substrate 213 at which the source electrode 224 is electrically coupled with the source region 219 and the second body region 221. In the present embodiment, the opening of the interlayer film 222, through which a part of the source region 219 and the second body region 221 are exposed from the interlayer film 222, provides the contact portion 226.

Thus, the structure of the MOSFET is formed. In this structure, when a predetermined voltage is applied to the gate electrode 218, a reverse type channel is formed at a part of the channel region 12, which is disposed on an opposite side of the gate electrode 18 with respect to the gate insulation film 217. This, current flows between the source electrode 224 and the drain electrode 225 via the channel.

Next, the outer periphery structure such as the diode region disposed on the outer periphery of the cell region will be explained with reference to FIGS. 19-21.

Figure 19:
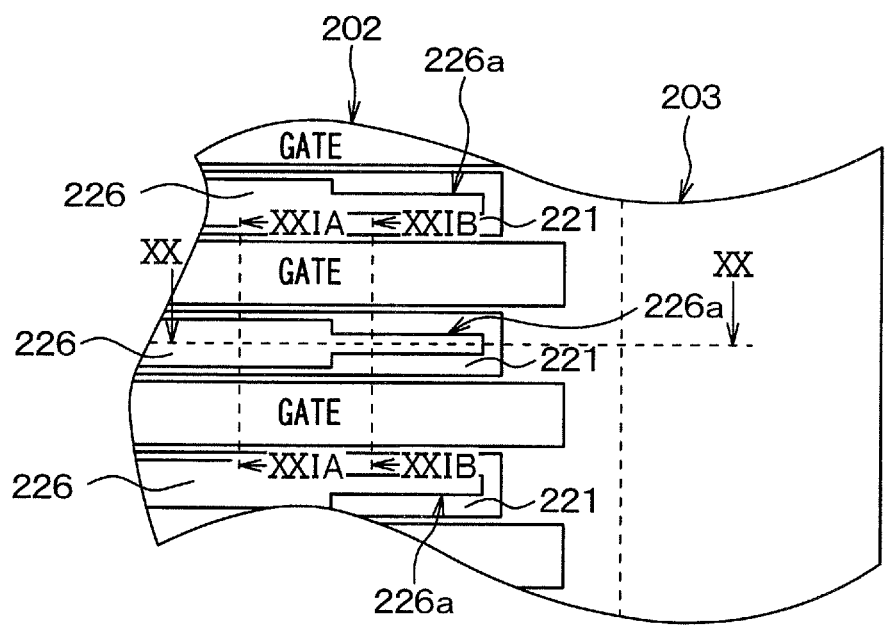
FIG. 19 is a diagram showing a partially enlarged cross sectional view of a part XIX of the chip in FIG. 17.

FIG. 19 shows a partially enlarged cross sectional view of a part XIX of the chip in FIG. 17. In FIG. 19, the source electrode 224 is not shown. Since the diode region is disposed on the outer periphery of the cell region, an outer periphery region 203 is disposed on the out side of the diode region.

As shown in FIG. 19, the trench 216, the gate insulation film 217 and the gate electrode 218 provide the trench gate structure. The trench gate structure extends to a boundary between the element portion 202 and the outer periphery region 203. Thus, the trench 216 is formed in the element portion 202. Here, in FIG. 19, the trench gate structure is shown as "GATE."

Figure 20:
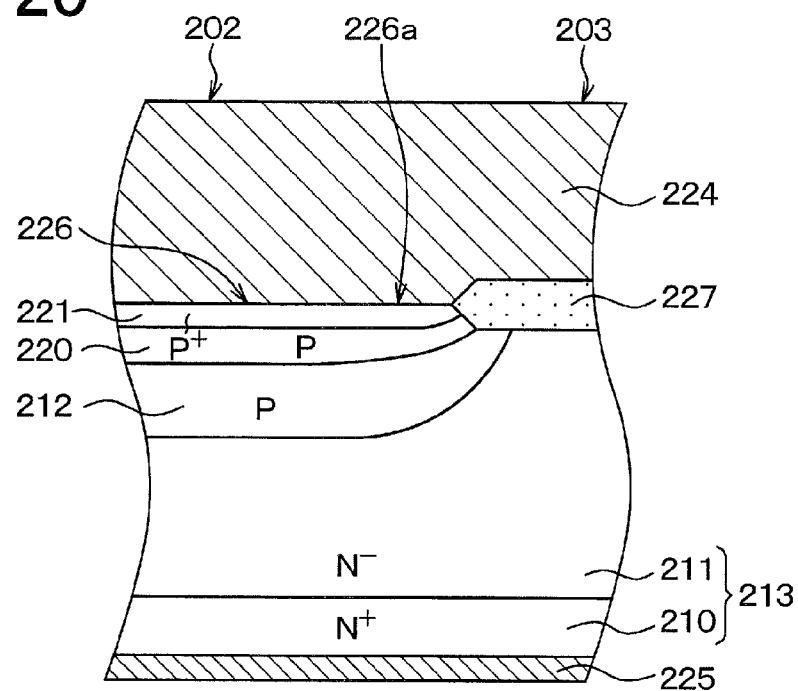
FIG. 20 is a diagram showing a cross sectional view of the chip taken along line XX-XX in FIG. 19.

FIG. 20 shows a cross sectional view of the chip taken along line XX-XX in FIG. 19. As shown in FIG. 20, the channel region 212 extends to the outer periphery region 203. In the element portion 202, the first body region 220 is formed in a surface portion of the channel region 212. The second body region 221 is formed in a surface portion of the first body region 220. Further, in the outer periphery region 203, an oxide film 227 made of $SiO_2$ or the like is formed on the one surface 214 of the substrate 213. One end of the oxide film 227 on the element portion side provides an utmost outer end (i.e., terminal end) of the contact portion 226. Here, the terminal end of the contact portion 226 is the nearest part of the outer periphery region 203. Here, a RESURF region having the P– conductive type may be formed in a surface portion of the drift layer 211.

As shown in FIG. 19, the width of a part of the opening as the contact hole 223 of the interlayer film 222 at the end portion 226a of the contact portion 226 on the outer periphery region side is narrower than the width of the other part of the opening of the interlayer film 222, which is disposed on an inside of the end portion 226a and on the element portion side. Here, the width of the opening is defined as a dimension along with a direction perpendicular to an extending direction of the contact portion 226. The width of the opening of the contact hole 223 is adjusted in a whole of the element portion 222.

In the present embodiment, the end portion 226a of the contact portion 226 on the outer periphery region side is disposed in the diode region. The other part of the opening of the interlayer film 222 is disposed in the cell region.

Figure 21A:
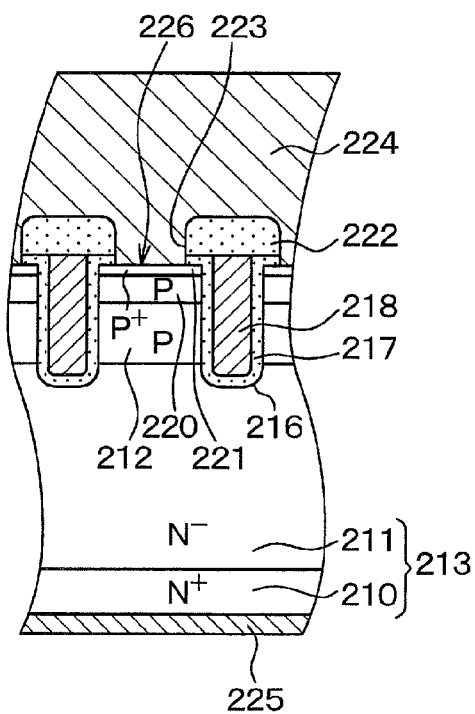
FIG. 21A is a diagram showing a cross sectional view of the chip taken along line XXIA-XXIA in FIG. 19.
Figure 21B:
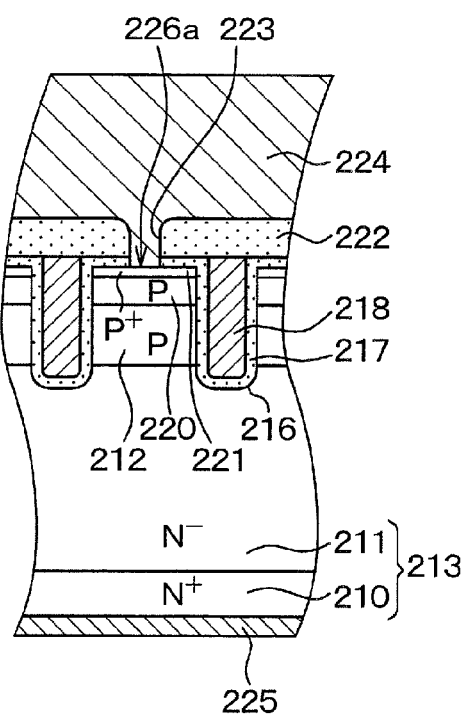
FIG. 21B is a diagram showing a cross sectional view of the chip taken along line XXIB-XXIB in FIG. 19.

The difference of the width of the contact hole 23 is shown in FIGS. 21A and 21B. FIG. 21A shows a cross sectional view of the chip taken along line XXIA-XXIA in FIG. 19, and FIG. 21B shows a cross sectional view of the chip taken along line XXIB-XXIB in FIG. 19. As shown in FIGS. 21A and 21B, in the diode region of the element portion 222, a PN junction between the drift layer 211 having the N– conductive type and the channel region 212 is formed between the source electrode 224 and the drain electrode 225. The diode element functions as a withstand region on the outer periphery of the cell region.

The width of the contact hole 223 is a width of the opening in the cell region of the element portion 222. The width of the contact hole 223 at the end portion 226a of the contact portion 226 is narrower than the width of the opening on the element side of the end portion 226a of the contact portion 226.

Thus, the area of the contact portion 226 at the end portion 226a of the contact portion 226 is different from the area of the contact portion on the element side of the end portion 226a because the width of the contact hole 223 at the end portion 226a is different from the width of the contact hole 223 on the element side. Thus, the contact portion 226 has a resistance per unit area at the end portion 226a on the outer periphery region side of the element portion 222, which is higher than a resistance per unit area on the element side of the end portion 226a. Specifically, the resistance of a path from the drift layer 211 to the source electrode 224 via the end portion 226a of the contact portion 226 is higher than the resistance of a path from the drift layer 211 to the source electrode 224 via the element portion side of the contact portion 226 with respect to the end portion 226a.

Here, the resistance per unit area is defined on the one surface 214 of the semiconductor substrate 213. This means a degree of the hole hard to flow in the substrate 213. Accordingly, the resistance per unit area does not provide a contact resistance between the substrate 213 and the source electrode 224. The above features provide the structure of the semiconductor device.

Next, a manufacturing method of the chip 1 will be explained as follows. First, the wafer having the N+ conductive type is prepared. Then, the drift layer 211 having the N– conductive type is epitaxially grown on the surface of the wafer. The channel region 212, the first body region 220, the second body region 221 and the source region 219 are formed in surface portions of the drift layer 211 by an ion implantation method and a thermal diffusion method. Then, the trench 216 is formed in the element portion 202 of the wafer such that the trench 216 penetrates the channel region 212 and reaches the drift layer 211.

After that, the inner wall of the trench 216 is thermally oxidized in an oxygen atmosphere so that the gate insulation film 217 is formed. Then, a poly silicon film is formed on the gate insulation film 217 by a CVD method or the like. The poly silicon film provides the gate electrode 218. Then, an unnecessary part of the poly silicon film on the gate insulation film 217 is removed, and the interlayer film 222 is formed on the gate insulation film 217 by the CVD method or the like. The interlayer film 222 covers the gate electrode 218. The contact hole 223 is formed in the interlayer film 222 and the gate insulation film 217 by a photo lithography and etching method, and the contact portion 226 is also formed.

In the above process, the contact hole 223 is formed in the interlayer film 222 such that the width of the contact hole 223 at the end portion 226a of the contact portion 226 is narrower than the width of the contact hole 223 on the element portion side from the end portion 226a of the contact portion 226.

Then, the source electrode 224 made of aluminum or the like is formed on the one surface 214 of the substrate 213 such that the source electrode 224 fills in the contact hole 223. Further, an insulation film (not shown) is formed to cover each electrode, and then, the gate pad 204 and the source pad 205 are formed. Then, the back side of the wafer is polished and ground, and the drain electrode 225 made of aluminum or the like is formed on the backside of the wafer. Further, an insulation film is formed, and the drain pad is provided. After that, the wafer is cut and diced so that the wafer is divided into multiple chips. Thus, the semiconductor chip 201 according to the present embodiment is completed.

In the present embodiment, the width of the contact hole 223 at the end portion 226a of the contact portion 226 is narrower than the width of the contact hole 223 on the element portion side from the end portion 226a.

Thus, the hole accumulated in the outer periphery region 203 of the chip 201 does not easily flows near the end portion 226a of the contact portion 226. Thus, in case of the recovery, the hole does not flow to be concentrated at the end portion 226a of the contact portion 226. This will be explained with reference to FIG. 22.

Figure 22:
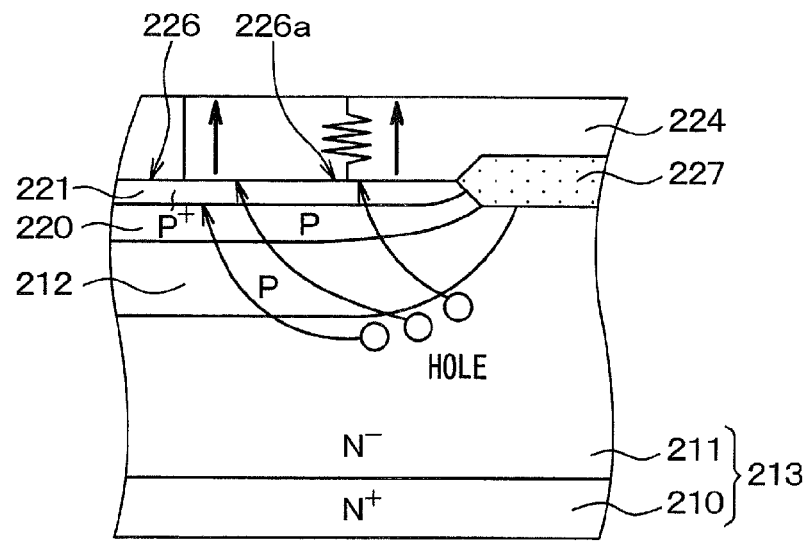
FIG. 22 is a diagram showing a hole flowing from an outer periphery region to a contact portion in case of recovery.

FIG. 22 shows a flow of the hole from the outer periphery region 203 to the contact portion 226 in case of the recovery. FIG. 22 corresponds to the cross section of line XX-XX in FIG. 19. In FIG. 22, the source electrode 224 and the drain electrode 225 are not shown.

When the built-in diode in the MOSFET is energized, the hole flows from the first body region 220 to the drift layer 211, and the hole is accumulated in the drift layer 211. Then, when the MOSFET turns on, the hole flowing to the drift layer 211 flows back to the first body region side. This back flow current provides the recovery current.

In this case, the hole accumulated in the drift layer 211 of the outer periphery region 203 is to be discharged to the source electrode 224 via the end portion 226a of the contact portion 226. However, in the present embodiment, the width of the contact hole 223 at the end portion 226a of the contact portion 226 is narrower than the end portion 226a on the element portion side. Thus, the resistance from the outer periphery region 203 to the source electrode 224 via the end portion 226a of the contact portion 226 becomes high. Accordingly, as shown n FIG. 22, the hole accumulated in the outer periphery region 203 does not easily flow into the end portion 226a of the contact portion 226, but easily flows to a part of the contact portion 226 on the element portion side.

When the resistance of the path via the end portion 226a of the contact portion 226 is high, the hole is not easily concentrated at the end portion 226a of the contact portion 226. Accordingly, the hole flow from the outer periphery region 203 to the contact portion 226 is not easily concentrated at one point. Thus, the hole uniformly flows from the outer periphery region 203 to the contact portion 226. Thus, the sufficient recovery withstand amount is stably obtained.

The width of the contact hole 223 provides to control the flow of the hole in the path to the source electrode 224. Thus, the sufficient recovery withstand amount is obtained without depending on the position of the wire bonding on the source pad 205. Accordingly, the recovery withstand amount of the semiconductor chip 201 is not affected by the bonding position of the wire on the source pad 205.

In the present embodiment, the resistance at the end portion 226a of the contact portion 226 is higher than the resistance of a part of the element portion 202 disposed on an inner side from the end portion 226a. Thus, the valance of the resistance of the element portion 202 is maintained at every place of the element portion 202. Thus, the resistance at the end portion 226a of the contact portion 226 is equalized in a whole of the element portion 202, so that the recovery withstand amount is stably obtained.

The source region 219 corresponds to the first impurity region, and the support substrate 210 corresponds to the second impurity region. Further, the source electrode 224 corresponds to the first electrode, and the drain electrode corresponds to the second electrode.

Tenth Embodiment

Figure 23:
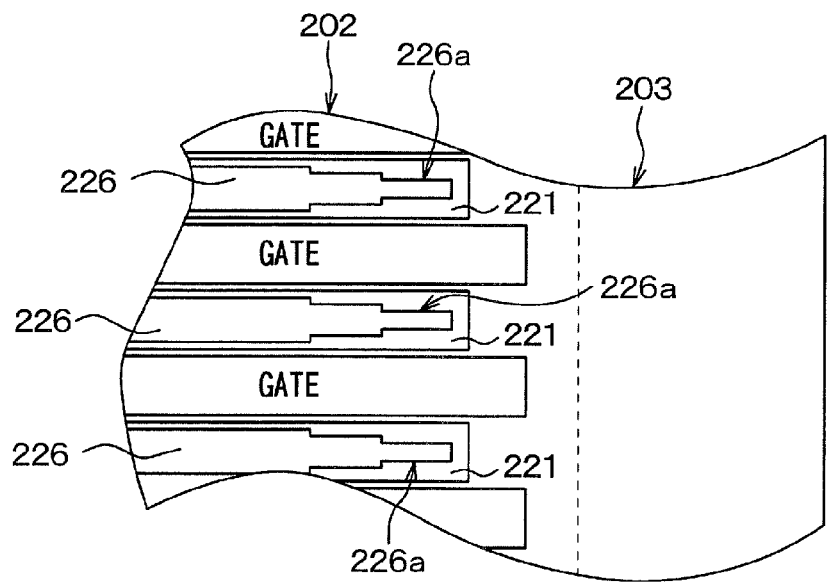
FIG. 23 is a diagram showing a partially enlarged plan view of a semiconductor chip according to a tenth embodiment.

FIG. 23 shows a partially enlarged plan view of a semiconductor chip according to a tenth embodiment. FIG. 23 corresponds to a part XIX in FIG. 17.

As shown in FIG. 23, the width of the contact hole 223 at the end portion 226a of the contact portion 226 is made narrower in a step-wise manner toward the utmost end of the contact portion 226. Thus, the resistance from the drift layer 211 of the outer periphery region 203 to the source electrode 224 via the contact portion 226 is made higher in a step-wise manner toward the utmost end of the contact portion 226. Thus, the resistance of the end portion 226a of the contact portion 226 is adjusted finely.

In FIG. 23, the width of the contact hole 223 is made narrower in the step-wise manner toward the utmost end of the contact portion 226. Alternatively, the width of the contact hole 223 is made narrower continuously toward the utmost end of the contact portion 226. In this case, an utmost end of the contact hole 223 on the utmost outer periphery region side may be rounded in view of the electric field concentration. Thus, the utmost end of the contact hole 223 may not be sharp.

Eleventh Embodiment

In the ninth and tenth embodiments, the width of the contact hole 223 is adjusted for controlling the resistance of the path via the contact portion 226. In the eleventh embodiment, the impurity concentration of the second body region 221 is adjusted for controlling the resistance of the path via the semiconductor substrate 213.

Figure 24:
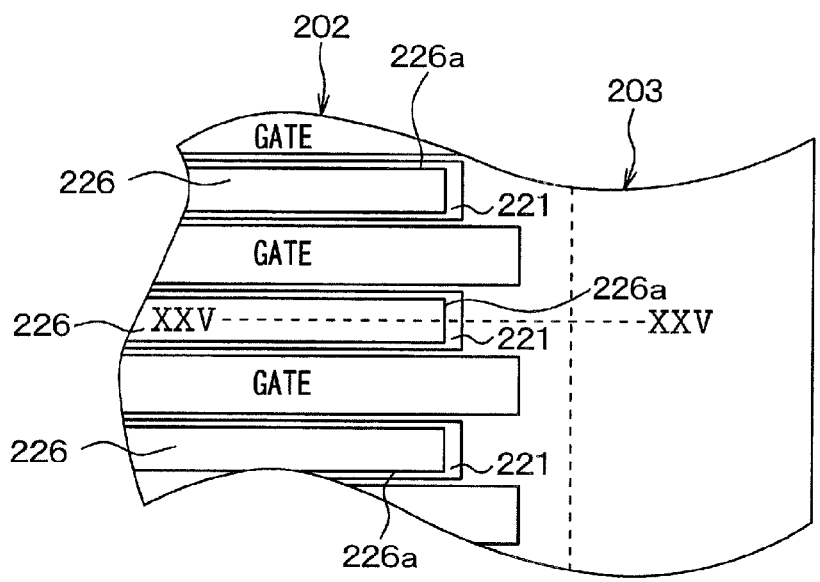
FIG. 24 is a diagram showing a partially enlarged plan view of a semiconductor chip according to an eleventh embodiment.

FIG. 24 shows a partially enlarged plan view of a semiconductor chip according to an eleventh embodiment. FIG. 24 corresponds to a part XIX in FIG. 17. As shown in FIG. 24, the width of the contact portion 226 in a direction perpendicular to the extending direction of the contact portion 226 on the one surface 214 of the substrate 213 is constant in the end portion 226a and other portions of the contact portion 226.

Figure 25:
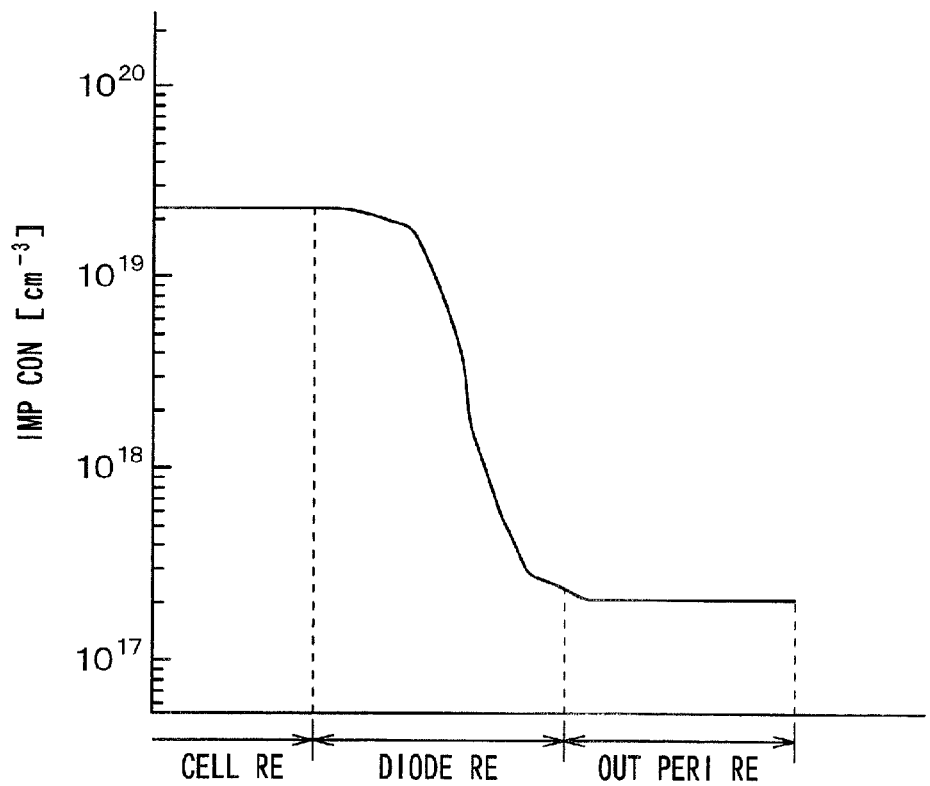
FIG. 25 is a graph showing an impurity concentration distribution of a semiconductor substrate along with line XXV-XXV in FIG. 24.

In the present embodiment, the second body region 221 is formed as follows. FIG. 25 shows an impurity concentration distribution of a semiconductor substrate 213 on the one surface 214 along with line XXV-XXV in FIG. 24.

As shown in FIG. 25, in the present embodiment, the impurity concentration of the end portion 226a of the contact portion 226 in the second body region 221, i.e., the impurity concentration of the diode region of the second body region 221 is lower than the impurity concentration of a part of the contact portion 226 on an inner side from the end portion 226a, i.e., the impurity concentration of the cell region of the second body region 221. Specifically, the impurity concentration of the end portion 226a of the contact portion 226 in the second body region 221 is gradually reduced from the impurity concentration of a part of the contact portion 226 on an inner side from the end portion 226a. Specifically, the impurity concentration of the diode region of the second body region 221 is reduced from the impurity concentration of the cell region of the second body region 221.

Thus, the resistance of a region having a low impurity concentration of the second body region 221 becomes high. Thus, the resistance per unit area in the end portion 226a of the element portion 202 on the outer periphery region side is higher than the resistance per unit area in the part of the contact portion on an inner side from the end portion 226a. Here, the part of the second body region 221 in the cell region has a constant impurity concentration.

Accordingly, since the impurity concentration of the second body region 221 is adjusted for the resistance of the path via the contact portion 226, the width of the contact hole 223 is constant. Alternatively, both of the impurity concentration of the second body region 221 and the width of the contact hole 223 may be adjusted.

The above semiconductor chip is manufactured as follows. For example, when the second body region 221 is formed, an impurity for providing the second body region 221 is implanted in the cell region. The impurity is thermally diffused such that the impurity concentration of the end portion 226a of the contact portion 226 in the second body region 221, i.e., the impurity concentration of the diode region of the second body region 221 is lower than the impurity concentration of a part of the contact portion 226 on an inner side from the end portion 226a, i.e., the impurity concentration of the cell region of the second body region 221. When the second body region 221 is formed, a mask having an opening corresponding to the diode region is arranged, and then, the impurity is implanted such that the dose amount of the impurity in the diode region is smaller than the dose amount of the impurity in the cell region. Then, the impurity is thermally diffused.

In the above, the impurity concentration of the second body region 221 is controlled. In some cases, the semiconductor chip may include only one of the first and second body regions 221, 220. For example, the first body region 220 may not be in the chip. In this case, the impurity concentration of the second body region 221 is controlled. Alternatively, when the second body region 221 is not in the chip, the impurity concentration of the first body region 220 is controlled.

The second body region 221 provides a body region.

Other Embodiments

Figure 26:
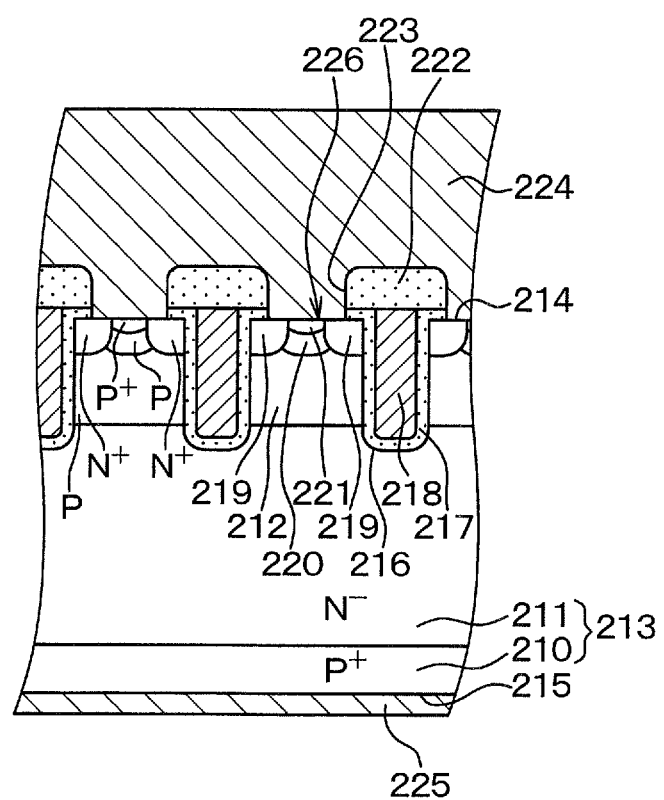
FIG. 26 is a diagram showing a cross sectional view of a semiconductor device having an IGBT as a semiconductor element according to another embodiment.
Figure 27A:
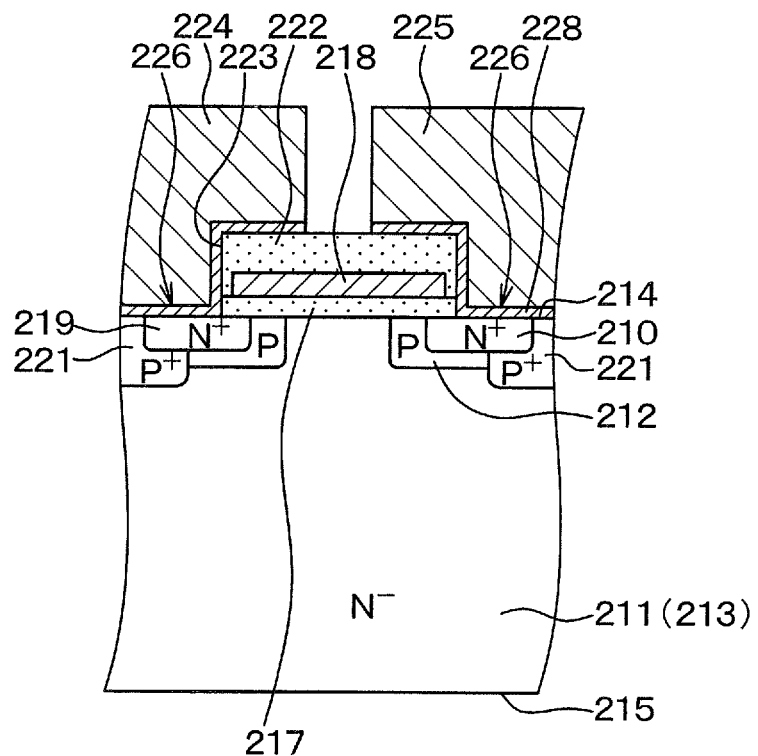
FIG. 27A is a diagram showing a cross sectional view of a semiconductor device having a lateral type semiconductor element according to another embodiment.
Figure 27B:
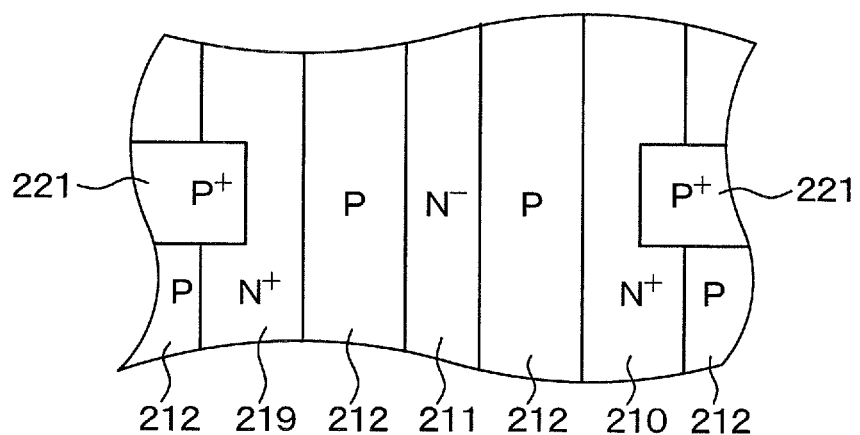
FIG. 27B is a diagram showing a plan view of the device in FIG. 27A.

The semiconductor element in the cell region of the element portion 202 may be a MESFET, an IGBT or the like, instead of the MOSFET. FIG. 26 shows a semiconductor device in which an IGBT as a semiconductor element is formed in the element portion 202. FIG. 26 corresponds to a cross section along line XVIII-XVIII in FIG. 17. In case of the IGBT, as shown in FIG. 26, the support substrate 210 having the N+ conductive type in FIG. 18 is replaced to the support substrate 210 having the P+ conductive type. Further, the gate structure may be a planar structure, instead of the trench gate type structure. Further, the semiconductor element such as the MOSFET, the MESFET and the IGBT may be a lateral type device, instead of the vertical type device. Here, in the vertical type device, the current flows between the one surface 214 and the other surface 215 of the semiconductor substrate 213. In the lateral type device, the current flows along with the one surface 214 or the other surface 215 of the semiconductor substrate 213. FIG. 27A shows a semiconductor device having a lateral type semiconductor element in the element portion 202. FIG. 27B is a plan view of the device in FIG. 27A. In FIG. 27B, the source electrode 224 and the like formed on the one surface 214 of the substrate 213 are not shown.

As shown in FIGS. 27A and 27B, the semiconductor device includes multiple P conductive type channel regions 212, which are disposed in a surface portion of the drift layer 211 having the N− conductive type. The channel regions 212 are disposed at predetermined intervals. The body region 221 having the P conductive type is formed in the channel region 212. The body region 221 penetrates the channel region 212. The source region 219 having the N conductive type is formed on an inner side of the body region 221 so that the source region 219 is adjacent to the channel region 212 on one side. The drain region 210 having the N conductive type is formed on an inner side of the body region 221 so that the drain region 210 is adjacent to the channel region on the other side.

The gate insulation film 217 is formed on the surface of the drift layer 211 such that the gate insulation film 217 covers the surface of the channel region 212. The gate electrode 218 is formed on the gate insulation film 217. The gate electrode 218 is covered with the interlayer film 222. The interlayer film 222 includes the contact hole 223.

The source electrode 224 and the drain electrode 225 are formed on the one surface 214 of the substrate 213 via the barrier metal film 228. The source electrode 224 is electrically coupled with the source region 219, the channel region 212 and the body region 221 through the contact hole 223. The drain electrode 225 is electrically coupled with the drain region 210, the channel region 212 and the body region 221 through the contact hole 223.

Thus, the semiconductor device may be a lateral type device in which the current flows along with the one surface 214 or the other surface 215 of the substrate 213.

In the semiconductor device, the contact portion 226 is electrically coupled with the semiconductor substrate 213 and the source electrode 224. Further, the contact portion 226 is electrically coupled with the semiconductor substrate 213 and the drain electrode 225. Specifically, the source electrode 224 is electrically coupled with the source region 219, the channel region 212 and the body region 221 through the contact portion 226. The drain electrode 225 is electrically coupled with the drain region 210, the channel region 212 and the body region 221 through the contact portion 226. Specifically, the contact portion 226 is provided through the opening of the interlayer film 222. A part of the source region 219, a part of the drain region 210, a part of the channel region 212 and a part of the body region 221 are exposed through the contact hole 222. The drain region 210 corresponds to the second impurity region. The device may include the body region 221, alternatively, the device may includes the body region 221.

Figure 28:
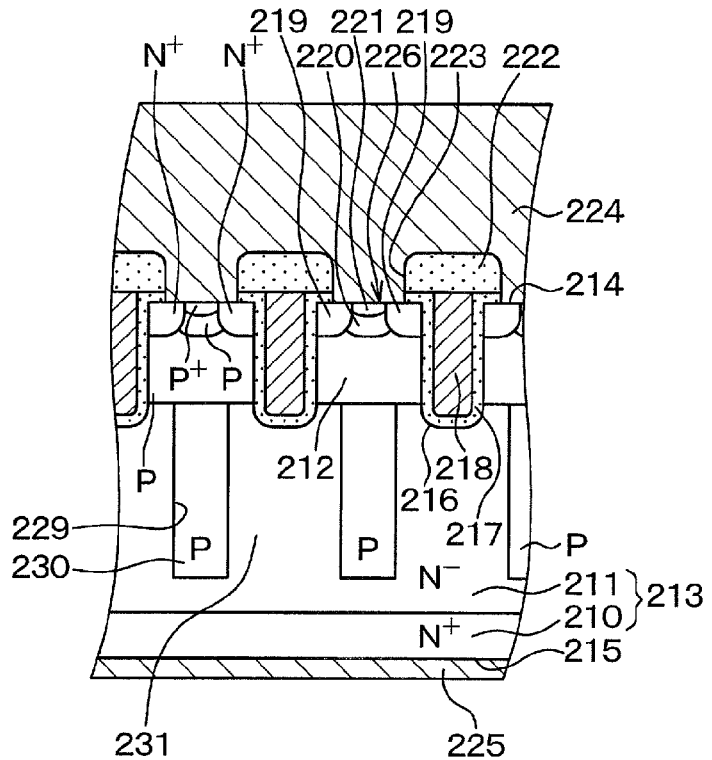
FIG. 28 is a diagram showing a cross sectional view of a semiconductor device having a semiconductor element with a super junction structure according to another embodiment.

The semiconductor device may include a super junction structure in the substrate 213. FIG. 28 shows the semiconductor device having the semiconductor element with the super junction structure. FIG. 27 corresponds to a cross section along line XVIII-XVIII in FIG. 17.

As shown in FIG. 28, in the above semiconductor device, multiple trenches 229 are formed in the drift layer 211. Each trench 229 has a longitudinal direction, which is a direction perpendicular to a sheet of FIG. 28. The trenches 229 have a stripe shape. The P conductive type region 230 is embedded in the trench 229. The N conductive type region 231 and the P conductive type region 230 are alternately arranged. The N conductive type region 231 is provided by a part of the rift layer 211 between trenches 229. Thus, the super junction structure is formed. The trench 216 reaches the N conductive type region 231. In such a device, the above feature according to the ninth to eleventh embodiments can be provided.

In FIG. 28, the trench 229 is formed so as to expose the support substrate 210. The P conductive type region 230 may be embedded in the trench 229 so that the super junction structure is formed.

Figure 29:
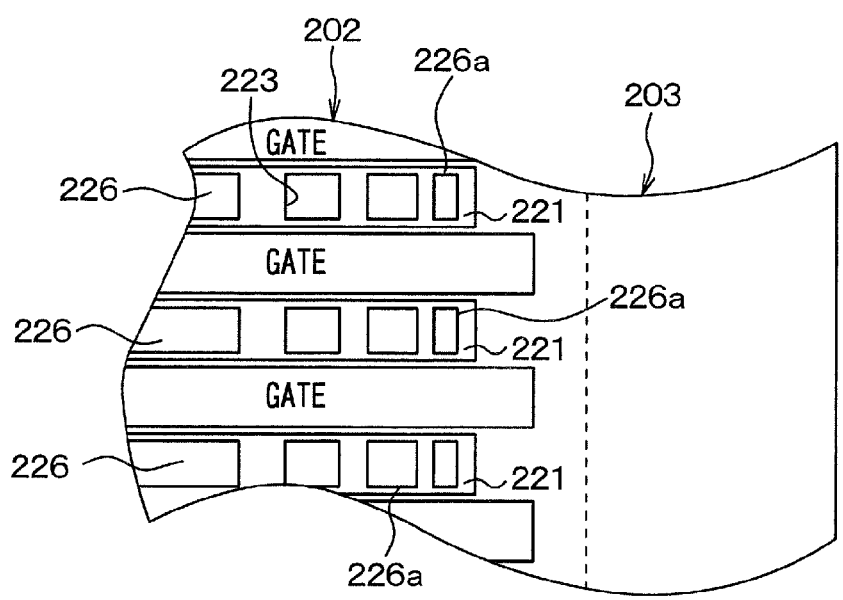
FIG. 29 is a diagram showing a partially enlarged plan view of a semiconductor chip according to another embodiment.

In the ninth and tenth embodiments, the contact hole 223 is formed continuously from a center to the end portion 226a of the contact portion 226. At the end portion 226a of the contact portion 226, the contact hole 223 may be formed intermittently. FIG. 29 is a diagram showing a partially enlarged plan view of a semiconductor chip according to another embodiment.

As shown in FIG. 29, the contact hole 223 at the end portion 226a of the contact portion 226 includes multiple openings as via holes. The area of the openings is made small toward the outer periphery region 203. Thus, the resistance per unit area in the end portion 226a of the contact portion 226 on the outer periphery region side is higher than the resistance per unit area in a part of the contact portion 226 disposed on the inner side from the end portion 226a.

Here, when the contact hole 223 in the end portion 226a of the contact portion 226 includes multiple openings, each of which has the same area, the resistance per unit area in the end portion 226a of the contact portion 226 on the outer periphery region side can be controlled to be higher than the resistance per unit area in a part of the contact portion 226 disposed on the inner side from the end portion 226a.

In the above embodiments, the drift layer 211 is formed on the support substrate 210. A buffer layer such as a field stop layer may be formed on the support substrate 210. In this case, the buffer layer may provide a part of the rift layer 211 on the support substrate side. Specifically, the buffer layer provides a part of the drift layer 211. Thus, the support substrate 210 contacts the drift layer 211, i.e., the buffer layer. The substrate 210 has the impurity concentration higher than the drift layer 211. Further, the substrate 210 is separated from the channel region 212.

In the above embodiments, the element portion 202 includes the cell region and the diode region. Alternatively, the element portion 202 may include only the cell region. In this case, the outer periphery of the cell region provides an end portion.

The above disclosure has the following aspects.

According to a first aspect of the present disclosure, a semiconductor device includes: a semiconductor substrate having a first conductive type and including a first surface and a second surface opposite to the first surface; an interlayer film disposed on the first surface of the semiconductor substrate; a surface electrode disposed on the interlayer film; a surface pad for electrically coupling with an external device, the surface pad disposed on the surface electrode; a backside electrode disposed on the second surface of the semiconductor substrate; an element area; and an outer periphery area disposed on an outer periphery of the element area. The element area includes: a cell portion having a vertical semiconductor element for flowing current between the surface electrode and the backside electrode, the vertical semiconductor element including an element structure on a first surface side of the semiconductor substrate; and a removal portion disposed on an outer periphery of the cell portion and including a plurality of contact regions on the first surface side of the semiconductor substrate, each contact region having a second conductive type. The surface electrode in the removal portion is electrically coupled with each contact region through a first contact hole in the interlayer film. The surface electrode in the cell portion is electrically coupled with the semiconductor substrate through a second contact hole in the interlayer film. A part of the surface electrode in the removal portion facing each contact region through a corresponding first contact hole is defined as a contact portion. The surface electrode includes a plurality of notches, each of which is disposed on a shortest distance line segment between a corresponding contact portion and the surface pad.

In the above device, the hole flowing into the surface electrode via the contact hole in the removal portion flows into the surface pad to bypass the notch. Accordingly, the distance of the hole path from the contact portion to the surface pad increases, compared with a case where the device has no notch. Thus, the resistance of the hole path increases, and therefore, the hole does not easily flows into the contact region. Thus, even if the impurity concentrations of the contact regions are varied, the hole concentration at a specific contact region is restricted. Thus, the recovery withstand of the device is stably obtained.

Alternatively, the surface electrode may have a plane shape with a straight portion and a corner portion. Each first contact hole is arranged along with an outer circumference of the surface electrode. The plurality of notches include a first notch and a second notch. The first notch is disposed on the shortest distance line segment between the surface pad and the contact portion, which is disposed along with the straight portion of the surface electrode. The second notch is disposed on the shortest distance line segment between the surface pad and the contact portion, which is disposed along with the corner portion of the surface electrode. Dimensions of the first notch are smaller than the second notch. In this case, the hole accumulated in a drift layer of the semiconductor element uniformly flows into the surface electrode.

Alternatively, the second notch may include a maximum second notch disposed on the shortest distance line segment between the surface pad and the contact portion, which is disposed at a center along with the corner portion of the surface electrode. The second notch further includes a minimum second notch adjacent to the first notch, and dimensions of the second notch continuously increase from the minimum second notch to the maximum second notch. In this case, the resistance between the surface pad and the contact portion disposed at the center along with the corner portion is maximized, and the resistance between the surface pad and each contact portion gradually increases from the first notch to the maximum second notch. Thus, the variation of the hole flowing from each contact portion to the surface electrode is reduced.

Alternatively, the surface electrode may have a plane shape with a pair of corner portions, which are opposed to each other. A distance of a hole path between the surface pad and the contact portion, which is disposed along with one corner portion, is substantially equal to a distance of a hole path between the surface pad and the contact portion, which is disposed along with the other corner portion. In this case, the current concentration at a specific contact portion along with the corner portion is restricted.

Alternatively, the element area may further include a channel region having the second conductive type and a body region having the second conductive type. The channel region is disposed on the first surface side of the semiconductor substrate. The body region is disposed in a surface portion of the channel region. An impurity concentration of the body region is higher than the channel region. The body region is electrically coupled with the surface electrode through the second contact hole. An impurity concentration of each contact region is higher than the channel region, and lower than the body region. In this case, the hole accumulated in the outer periphery region does not easily flows into the contact region, so that the hole concentration at the contact region is restricted.

Alternatively, the surface electrode may have a plane shape with a straight portion and a corner portion. Each first contact hole is arranged along with an outer circumference of the surface electrode. A plurality of the first contact holes include a corner first contact hole and a straight first contact hole. The straight first contact hole is disposed along with the straight portion of the surface electrode, and the corner first contact hole is disposed along with the corner portion of the surface electrode. Dimensions of the corner first contact hole are smaller than the straight first contact hole. In this case, since the hole does not easily flow in the contact portion along with the corner portion, so that the hole uniformly flows into the surface electrode in case of the recovery.

Alternatively, a thickness of the surface electrode in the cell portion may be larger than a thickness of the surface electrode in the removal portion. In this case, the resistivity of the surface electrode in the removal portion is higher than the resistivity of the surface electrode in the cell portion. Accordingly, the hole concentration in the removal portion is restricted.

Alternatively, the surface electrode may include a first surface electrode and a second surface electrode. The first surface electrode contacts each contact region of the semiconductor substrate through a corresponding first contact hole. The second surface electrode contacts the semiconductor substrate through the second contact hole. The first surface electrode is electrically coupled with the second surface electrode. A resistivity of the first surface electrode is higher than the second surface electrode. In this case, the contact resistance between the semiconductor substrate and the first surface electrode is higher than the contact resistance between the semiconductor substrate and the second surface electrode. Thus, the hole concentration in the removal portion is restricted.

According to a second aspect of the present disclosure, a semiconductor device includes: a semiconductor substrate having a first conductive type and including a first surface and a second surface opposite to the first surface; an interlayer film disposed on the first surface of the semiconductor substrate; a surface electrode disposed on the interlayer film; a surface pad for electrically coupling with an external device, the surface pad disposed on the surface electrode; a backside electrode disposed on the second surface of the semiconductor substrate; an element area; and an outer periphery area disposed on an outer periphery of the element area. The element area includes: a cell portion having a vertical semiconductor element for flowing current between the surface electrode and the backside electrode, the vertical semiconductor element including an element structure on a first surface side of the semiconductor substrate; and a removal portion disposed on an outer periphery of the cell portion and including a plurality of contact regions on the first surface side of the semiconductor substrate, each contact region having a second conductive type. The surface electrode includes: a first surface electrode in the removal portion contacting each contact region of the semiconductor substrate through a first contact hole in the interlayer film; and a second surface electrode in the cell portion contacting the semiconductor substrate through a second contact hole in the interlayer film. The first surface electrode is electrically coupled with the second surface electrode. A resistivity of the first surface electrode is higher than the second surface electrode.

In the above device, the contact resistance between the semiconductor substrate and the first surface electrode is higher than the contact resistance between the semiconductor substrate and the second surface electrode. Thus, the hole concentration in the removal portion is restricted.

According to a third aspect of the present disclosure, a method of manufacturing a semiconductor device includes: forming an element area in a semiconductor substrate; forming an interlayer film on a first surface of the semiconductor substrate having a first conductive type; forming a surface electrode on the interlayer film; forming a surface pad for electrically coupling with an external device on the surface electrode; forming a backside electrode on a second surface of the semiconductor substrate, which is opposite to the first surface; and forming an outer periphery area on an outer periphery of the element area. The forming of the element area includes: forming an element structure on a first surface side of the semiconductor substrate in a cell portion so that the element structure provides a vertical semiconductor element for flowing current between the surface electrode and the backside electrode; and forming a plurality of contact regions on the first surface side of the semiconductor substrate in a removal portion. The removal portion is disposed on an outer periphery of the cell portion. Each contact region has a second conductive type. The forming of the surface electrode includes: forming a plurality of contact holes in the interlayer film in the removal portion; forming an electrode film on the interlayer film in such a manner that each contact hole is filled with the electrode film; and patterning the electrode film and forming a plurality of notches in the electrode film so that the surface electrode is obtained. A part of the electrode film in the removal portion facing each contact region through a corresponding contact hole is defined as a contact portion. Each notch is disposed on a shortest distance line segment between a corresponding contact portion and the surface pad.

In the above method, the hole flowing into the surface electrode via the contact hole in the removal portion flows into the surface pad to bypass the notch. Accordingly, the distance of the hole path from the contact portion to the surface pad increases, compared with a case where the device has no notch. Thus, the resistance of the hole path increases, and therefore, the hole does not easily flows into the contact region. Thus, even if the impurity concentrations of the contact regions are varied, the hole concentration at a specific contact region is restricted. Thus, the recovery withstand of the device is stably obtained.

According to a fourth aspect of the present disclosure, a method of manufacturing a semiconductor device includes: forming an element area in a semiconductor substrate; forming an interlayer film on a first surface of the semiconductor substrate having a first conductive type; forming a surface electrode on the interlayer film; forming a surface pad for electrically coupling with an external device on the surface electrode; forming a backside electrode on a second surface of the semiconductor substrate, which is opposite to the first surface; and forming an outer periphery area on an outer periphery of the element area. The forming of the element area includes: forming an element structure on a first surface side of the semiconductor substrate in a cell portion so that the element structure provides a vertical semiconductor element for flowing current between the surface electrode and the backside electrode; and forming a plurality of contact regions on the first surface side of the semiconductor substrate in a removal portion. The removal portion is disposed on an outer periphery of the cell portion. Each contact region has a second conductive type. The forming of the surface electrode includes: forming a plurality of first contact holes in the interlayer film in the removal portion; forming a first surface electrode film on the interlayer film in such a manner that each first contact hole is filled with the first surface electrode film; patterning the first surface electrode film and contacting the first surface electrode film on each contact region through a corresponding first contact hole film so that the first surface electrode is obtained; forming a second contact hole in the interlayer film in the cell portion; forming a second surface electrode film on the interlayer film in such a manner that the second contact hole is filled with the second surface electrode film; and patterning the second surface electrode film and contacting the second surface electrode film on the semiconductor substrate through the second contact hole so that the second surface electrode is obtained. A resistivity of the first surface electrode is higher than the second surface electrode.

In the above method, the contact resistance between the semiconductor substrate and the first surface electrode is higher than the contact resistance between the semiconductor substrate and the second surface electrode. Thus, the hole concentration in the removal portion is restricted.

According to a fifth aspect of the present disclosure, a semiconductor device includes: a drift layer having a first conductive type; a channel region having a second conductive type and disposed on the drift layer; a first impurity region having the first conductive type and disposed in a surface portion of the channel region, wherein the first impurity region is spaced a part from the drift layer via the channel region sandwiched therebetween, and has an impurity concentration higher than the drift layer; a gate electrode disposed on a first surface of the channel region via a gate insulation film; a second impurity region having the first or second conductive type and contacting the drift layer, wherein the second impurity region is spaced a part from the channel region, and has an impurity concentration higher than the drift layer; a first electrode electrically coupled with the first impurity region and the channel region; a second electrode electrically coupled with the second impurity region; an element portion including a semiconductor element having an insulation gate structure, wherein the semiconductor element is provided in such a manner that a part of the channel region opposite to the gate electrode via the gate insulation film provides a reverse type channel so that current flows between the first electrode and the second electrode through the channel; and an outer periphery region disposed on an outer periphery of the element portion. The element portion further includes a contact portion, through which the first electrode is electrically coupled with the first impurity region and the channel region. The contact portion extends on the first surface of the channel region. The contact portion includes an end portion and an inner portion. The end portion of the contact portion is disposed on an outer periphery region side, and the inner portion of the contact portion is disposed on an inner side from the end portion. A resistance per unit area in the end portion of the contact portion is higher than the inner portion of the contact portion.

In the above device, since the hole accumulated in the outer periphery region does not easily flow through the end portion of the contact portion, the hole is not concentrated at the end portion of the contact portion when the hole flows from the outer periphery region in case of the recovery. Thus, the hole is not easily concentrated at one point, and therefore, the hole flow from the outer periphery region to the contact portion is unformed. Thus, the sufficient recovery withstand amount is stably obtained.

Alternatively, the element portion may further include an interlayer film on the first surface of the channel region. The interlayer film includes an opening, through which a part of the first impurity region and a part of the channel region are exposed from the interlayer film. The contact portion is provided by the opening of the interlayer film. A width of the opening of the interlayer film in the end portion of the contact portion is narrower than a width of the opening of the interlayer film in the inner portion of the contact portion so that the resistance per unit area in the end portion of the contact portion is higher than the inner portion of the contact portion. Further, the width of the opening of the interlayer film in the end portion of the contact portion may be step-wisely made narrow toward an utmost end of the contact portion. Further, the width of the opening of the interlayer film in the end portion of the contact portion may be continuously made narrow toward an utmost end of the contact portion.

Alternatively, the element portion may further include a body region having the second conductive type. The body region is disposed in another surface portion of the channel region so that the body region provides a part of the contact portion. The body region has an impurity concentration higher than the channel region. The body region is electrically coupled with the first electrode. An impurity concentration of the body region in the end portion of the contact portion is lower than an impurity concentration of the body region in the inner portion of the contact portion so that the resistance per unit area in the end portion of the contact portion is higher than the inner portion of the contact portion.

Alternatively, in a whole of the element portion, the resistance per unit area in the end portion of the contact portion may be higher than the inner portion of the contact portion. In this case, the resistance of the element portion at any place is balanced, so that the resistance of the end portion of the contact portion is uniformed in a whole of the element portion. Thus, the recovery withstand amount is stably obtained.

Alternatively, the element portion may further include a plurality of trenches and a second conductive type region. Each trench is disposed in the drift layer, and has a longitudinal direction. The second conductive type region is embedded in the plurality of trenches. A part of the drift layer sandwiched between adjacent trenches provides a first conductive type region. The first conductive type region and the second conductive type region provide a super junction structure. In this case, an on-state resistance is reduced, and the recovery withstand amount is stably obtained.

According to a sixth aspect of the present disclosure, a semiconductor device includes: a drift layer having a first conductive type; first and second channel regions having a second conductive type and disposed in first and second surface portions of the drift layer, respectively, wherein the first channel region is spaced apart from the second channel region; a first impurity region having the first conductive type and disposed in the first channel region, wherein an impurity concentration of the first impurity region is higher than the drift layer; a second impurity region having the first conductive type and disposed in the second channel region, wherein an impurity concentration of the second impurity region is higher than the drift layer; a gate electrode disposed on a first surface of the drift layer via a gate insulation film; a first electrode electrically coupled with the first impurity region; a second electrode electrically coupled with the second impurity region; an element portion including a semiconductor element having an insulation gate structure, wherein the semiconductor element is provided in such a manner that a part of the channel region opposite to the gate electrode via the gate insulation film provides a reverse type channel so that current flows between the first electrode and the second electrode through the channel; and an outer periphery region disposed on an outer periphery of the element portion. The element portion further includes: a first contact portion, through which the first electrode is electrically coupled with the first impurity region and the channel region; and a second contact portion, through which the second electrode is electrically coupled with the second impurity region and the channel region. The first and second contact portions extend on the first surface of the channel region. Each of the first and second contact portions includes an end portion and an inner portion. The end portion of each of the first and second contact portions is disposed on an outer periphery region side, and the inner portion of each of the first and second contact portions is disposed on an inner side from a corresponding end portion. A resistance per unit area in the end portion of each of the first and second contact portions is higher than the inner portion of a corresponding contact portion.

In the above device, since the hole accumulated in the outer periphery region does not easily flow through the end portion of the contact portion, the hole is not concentrated at the end portion of the contact portion when the hole flows from the outer periphery region in case of the recovery. Thus, the sufficient recovery withstand amount is stably obtained.

Alternatively, the element portion may further include an interlayer film on the first surface of the channel region. The interlayer film includes an opening, through which a part of the first impurity region, a part of the second impurity region and a part of the channel region are exposed from the interlayer film. Each of the first and second contact portions is provided by the opening of the interlayer film. A width of the opening of the interlayer film in the end portion of each of the first and second contact portions is narrower than a width of the opening of the interlayer film in the inner portion of a corresponding contact portion so that the resistance per unit area in the end portion of a corresponding contact portion is higher than the inner portion of the corresponding contact portion. Further, the width of the opening of the interlayer film in the end portion of each of the first and second contact portions may be step-wisely made narrow toward an utmost end of a corresponding contact portion. Further, the width of the opening of the interlayer film in the end portion of each of the first and second contact portions may be continuously made narrow toward an utmost end of a corresponding contact portion.

Alternatively, the element portion may further include a body region having the second conductive type. The body region is disposed in another surface portion of the channel region so that the body region provides a part of the contact portion. The body region has an impurity concentration higher than the channel region. The body region is electrically coupled with the first electrode or the second electrode. An impurity concentration of the body region in the end portion of each of the first and second contact portions is lower than an impurity concentration of the body region in the inner portion of a corresponding contact portion so that the resistance per unit area in the end portion of the corresponding contact portion is higher than the inner portion of the corresponding contact portion.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
   a drift layer having a first conductive type;
   a channel region having a second conductive type and disposed on the drift layer;
   a first impurity region having the first conductive type and disposed in a surface portion of the channel region, wherein the first impurity region is spaced apart from the drift layer via the channel region sandwiched therebetween, and has an impurity concentration higher than the drift layer;
   a gate electrode disposed on a first surface of the channel region via a gate insulation film;
   a second impurity region having the first or second conductive type and contacting the drift layer, wherein the second impurity region is spaced apart from the channel region, and has an impurity concentration higher than the drift layer;
   a first electrode electrically coupled with the first impurity region and the channel region;
   a second electrode electrically coupled with the second impurity region;
   an element portion including a semiconductor element having an insulation gate structure, wherein the semiconductor element is provided in such a manner that a part of the channel region opposite to the gate electrode via the gate insulation film provides a reverse type channel so that current flows between the first electrode and the second electrode through the channel; and
   an outer periphery region disposed on an outer periphery of the element portion,
   wherein the element portion further includes a contact portion, through which the first electrode is electrically coupled with the first impurity region and the channel region,
   wherein the contact portion extends on the first surface of the channel region,
   wherein the contact portion includes an end portion and an inner portion,
   wherein the end portion of the contact portion is disposed on an outer periphery region side, and the inner portion of the contact portion is disposed on an inner side from the end portion of the element portion,
   wherein a resistance per unit area in the end portion of the contact portion is higher than a resistance per unit area in the inner portion of the contact portion,
   wherein the element portion further includes an interlayer film on the first surface of the channel region,
   wherein the interlayer film includes an opening, through which a part of the first impurity region and a part of the channel region are exposed from the interlayer film,
   wherein the contact portion is provided by the opening of the interlayer film, and
   wherein a width of the opening of the interlayer film in the end portion of the contact portion is narrower than a width of the opening of the interlayer film in the inner portion of the contact portion so that the resistance per unit area of a path from the drift layer to the first electrode in the end portion of the contact portion is higher than the resistance per unit area of a path from the drift layer to the first electrode in the inner portion of the contact portion.

2. The semiconductor device according to claim 1, wherein the width of the opening of the interlayer film in the end portion of the contact portion is stepwisely made narrow toward an utmost end of the contact portion.

3. The semiconductor device according to claim 1, wherein the width of the opening of the interlayer film in the end portion of the contact portion is continuously made narrow toward an utmost end of the contact portion.

4. The semiconductor device according to claim 1, wherein the element portion further includes a body region having the second conductive type,
wherein the body region is disposed in another surface portion of the channel region so that the body, region provides a part of the contact portion,
wherein the body, region has an impurity concentration higher than the channel region,
wherein the body region is electrically coupled with the first electrode, and
wherein an impurity concentration of the body region in the end portion of the contact portion is lower than an impurity concentration of the body region in the inner portion of the contact portion so that the resistance per unit area in the end portion of the contact portion is higher than the resistance per unit area in the inner portion of the contact portion.

5. The semiconductor device according to claim 1, wherein, in a whole of the element portion, the resistance per unit area in the end portion of the contact portion is higher than the resistance per unit area in the inner portion of the contact portion.

6. The semiconductor device according to claim 1, wherein the element portion further includes a plurality of trenches and a second conductive type region, wherein each trench is disposed in the drift layer and has a longitudinal direction, wherein the second conductive type region is embedded in the plurality of trenches, wherein a part of the drift layer sandwiched between adjacent trenches provides a first conductive type region, and wherein the first conductive type region and the second conductive type region provide a super junction structure.

7. A semiconductor device comprising:

a drift layer having a first conductive type;

a channel region having a second conductive type and disposed on the drift layer;

a first impurity region having the first conductive type and disposed in a surface portion of the channel region, wherein the first impurity region is spaced apart from the drift layer via the channel region sandwiched therebetween, and has an impurity concentration higher than the drift layer;

a gate electrode disposed on a first surface of the channel region via a gate insulation film;

a second impurity region having the first or second conductive type and contacting the drift layer, wherein the second impurity region is spaced apart from the channel region, and has an impurity concentration higher than the drift layer;

a first electrode electrically coupled with the first impurity region and the channel region;

a second electrode electrically coupled with the second impurity region;

an element portion including a semiconductor element having an insulation gate structure, wherein the semiconductor element is provided in such a manner that a part of the channel region opposite to the gate electrode via the gate insulation film provides a reverse type channel so that current flows between the first electrode and the second electrode through the channel; and an outer periphery region disposed on an outer periphery of the element portion, wherein the element portion further includes a contact portion, through which the first electrode is electrically coupled with the first impurity region and the channel region, wherein the contact portion extends on the first surface of the channel region, wherein the contact portion includes an end portion and an inner portion, wherein the end portion of the contact portion is disposed on an outer periphery region side, and the inner portion of the contact portion is disposed on an inner side from the end portion of the element portion, and wherein an area of the end portion of the contact portion is smaller than an area of the inner portion of the contact portion so that a resistance per unit area of a path from the drift layer to the first electrode in the end portion of the contact portion is higher than a resistance per unit area of a path from the drift layer to the first electrode in the inner portion of the contact portion.

8. A semiconductor device comprising:

a drift layer having a first conductive type;

a channel region having a second conductive type and disposed on the drift layer;

a first impurity region having the first conductive type and disposed in a surface portion of the channel region, wherein the first impurity region is spaced apart from the drift layer via the channel region sandwiched therebetween, and has an impurity concentration higher than the drift layer;

a gate electrode disposed on a first surface of the channel region via a gate insulation film;

a second impurity region having the first or second conductive type and contacting the drift layer, wherein the second impurity region is spaced apart from the channel region, and has an impurity concentration higher than the drift layer;

a first electrode electrically coupled with the first impurity region and the channel region;

a second electrode electrically coupled with the second impurity region;

an element portion including a semiconductor element having an insulation gate structure, wherein the semiconductor element is provided in such a manner that a part of the channel region opposite to the gate electrode via the gate insulation film provides a reverse type channel so that current flows between the first electrode and the second electrode through the channel; and an outer periphery region disposed on an outer periphery of the element portion, wherein the element portion further includes a contact portion, through which the first electrode is electrically coupled with the first impurity region and the channel region, wherein the contact portion extends on the first surface of the channel region, wherein the contact portion includes an end portion and an inner portion, wherein the end portion of the contact portion is disposed on an outer periphery region side, and the inner portion of the contact portion is disposed on an inner side from the end portion of the element portion, wherein an area of the end portion of the contact portion is smaller than an area of the inner portion of the contact portion so that a resistance per unit area in the end portion of the contact portion is higher than a resistance per unit area in the inner portion of the contact portion, and wherein a resistance of a path from the drift layer to the first electrode via the end portion of the contact portion is higher than a resistance of a path from the drift layer to the first electrode via the inner portion of the contact portion.

* * * * *